US011049937B2

(12) United States Patent
Cheng et al.

(10) Patent No.: US 11,049,937 B2
(45) Date of Patent: Jun. 29, 2021

(54) GATE STRUCTURES FOR SEMICONDUCTOR DEVICES

(71) Applicant: Taiwan Semiconductor Manufacturing Co., Ltd., Hsinchu (TW)

(72) Inventors: Chung-Liang Cheng, Changhua County (TW); Chun-I Wu, Taipei (TW); Huang-Lin Chao, Hillsboro, OR (US)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 16/657,017

(22) Filed: Oct. 18, 2019

(65) Prior Publication Data

US 2021/0118995 A1 Apr. 22, 2021

(51) Int. Cl.
| | |
|---|---|
| *H01L 29/06* | (2006.01) |
| *H01L 21/8238* | (2006.01) |
| *H01L 29/10* | (2006.01) |
| *H01L 29/78* | (2006.01) |
| *H01L 27/092* | (2006.01) |
| *H01L 29/66* | (2006.01) |

(52) U.S. Cl.
CPC .. *H01L 29/1037* (2013.01); *H01L 21/823807* (2013.01); *H01L 21/823821* (2013.01); *H01L 27/0924* (2013.01); *H01L 29/0665* (2013.01); *H01L 29/66795* (2013.01); *H01L 29/785* (2013.01)

(58) Field of Classification Search
CPC ............. H01L 21/823807; H01L 29/0673
See application file for complete search history.

(56) References Cited

U.S. PATENT DOCUMENTS

| | | | | |
|---|---|---|---|---|
| 2015/0380539 | A1* | 12/2015 | Colinge | H01L 29/66439 257/9 |
| 2017/0104061 | A1* | 4/2017 | Peng | H01L 21/845 |
| 2017/0179125 | A1* | 6/2017 | Bao | H01L 27/092 |
| 2018/0151373 | A1* | 5/2018 | Tsai | H01L 21/28088 |
| 2018/0151452 | A1* | 5/2018 | Doornbos | H01L 29/66469 |
| 2019/0131418 | A1* | 5/2019 | Ando | H01L 29/4966 |
| 2019/0221639 | A1* | 7/2019 | Tseng | H01L 29/0673 |

* cited by examiner

*Primary Examiner* — Shih Tsun A Chou
(74) *Attorney, Agent, or Firm* — Sterne, Kessler, Goldstein & Fox P.L.L.C.

(57) ABSTRACT

The structure of a semiconductor device with different gate structures configured to provide ultra-low threshold voltages and a method of fabricating the semiconductor device are disclosed. The method includes forming first and second nanostructured channel regions in first and second nanostructured layers, respectively, and forming first and second gate-all-around (GAA) structures surrounding the first and second nanostructured channel regions, respectively. The forming the first and second GAA structures includes selectively forming an Al-based n-type work function metal layer and a Si-based capping layer on the first nanostructured channel regions, depositing a bi-layer of Al-free p-type work function metal layers on the first and second nanostructured channel regions, depositing a fluorine blocking layer on the bi-layer of Al-free p-type work function layers, and depositing a gate metal fill layer on the fluorine blocking layer.

19 Claims, 26 Drawing Sheets

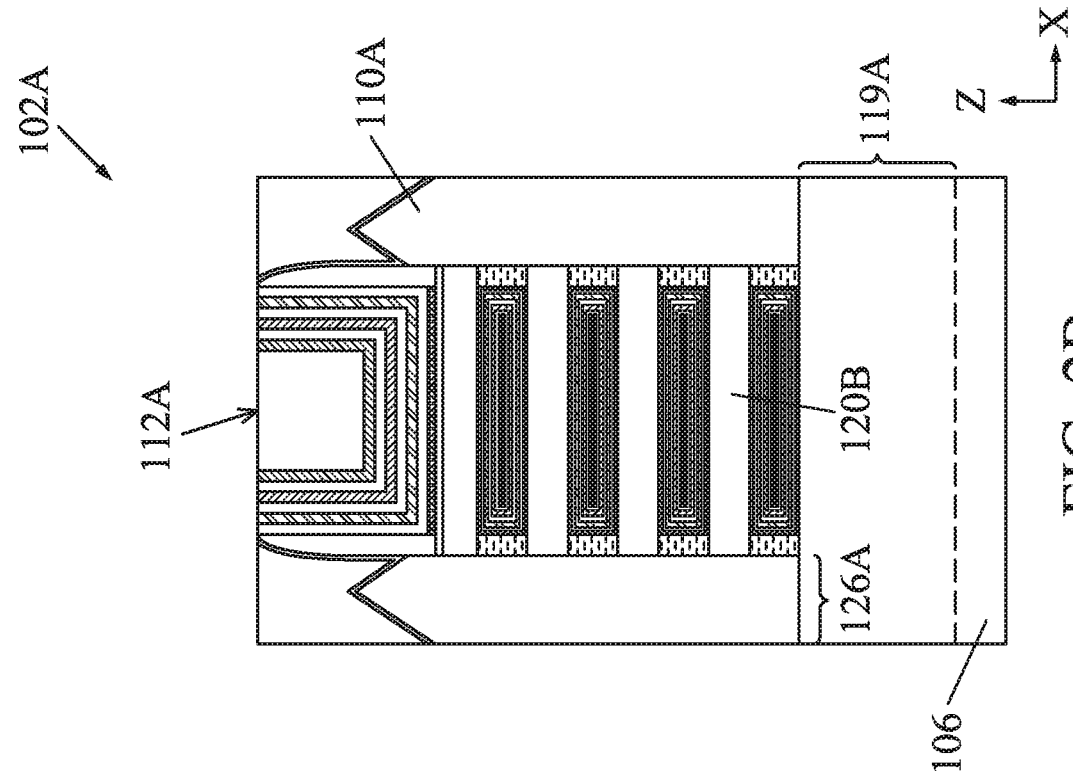
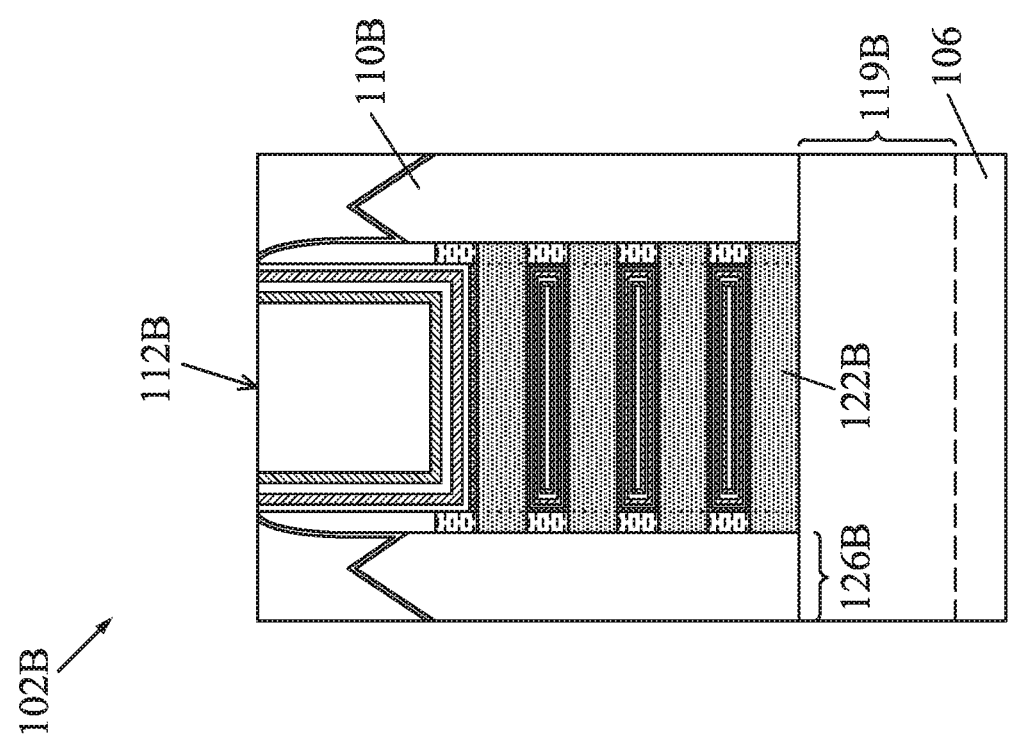

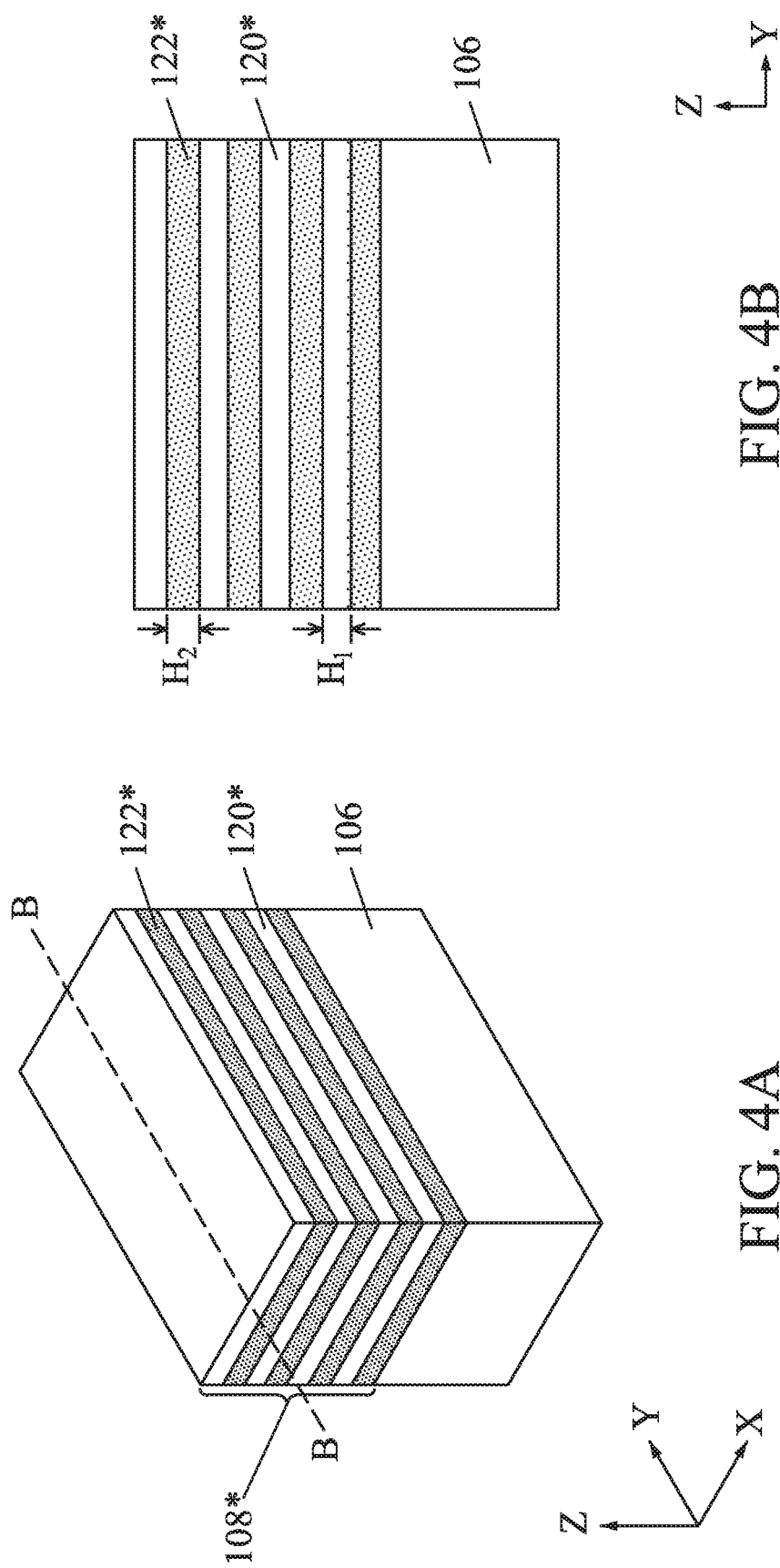

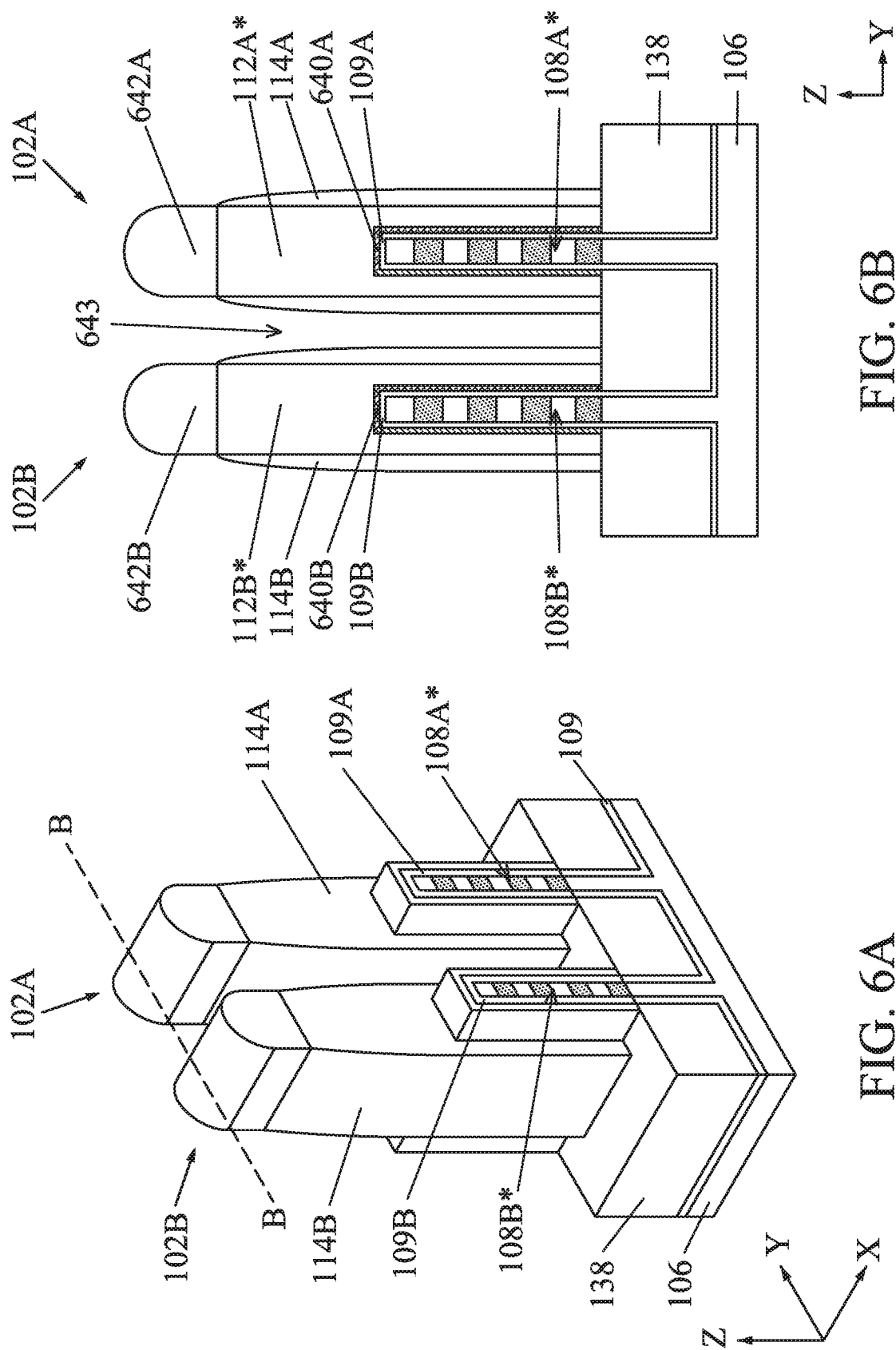

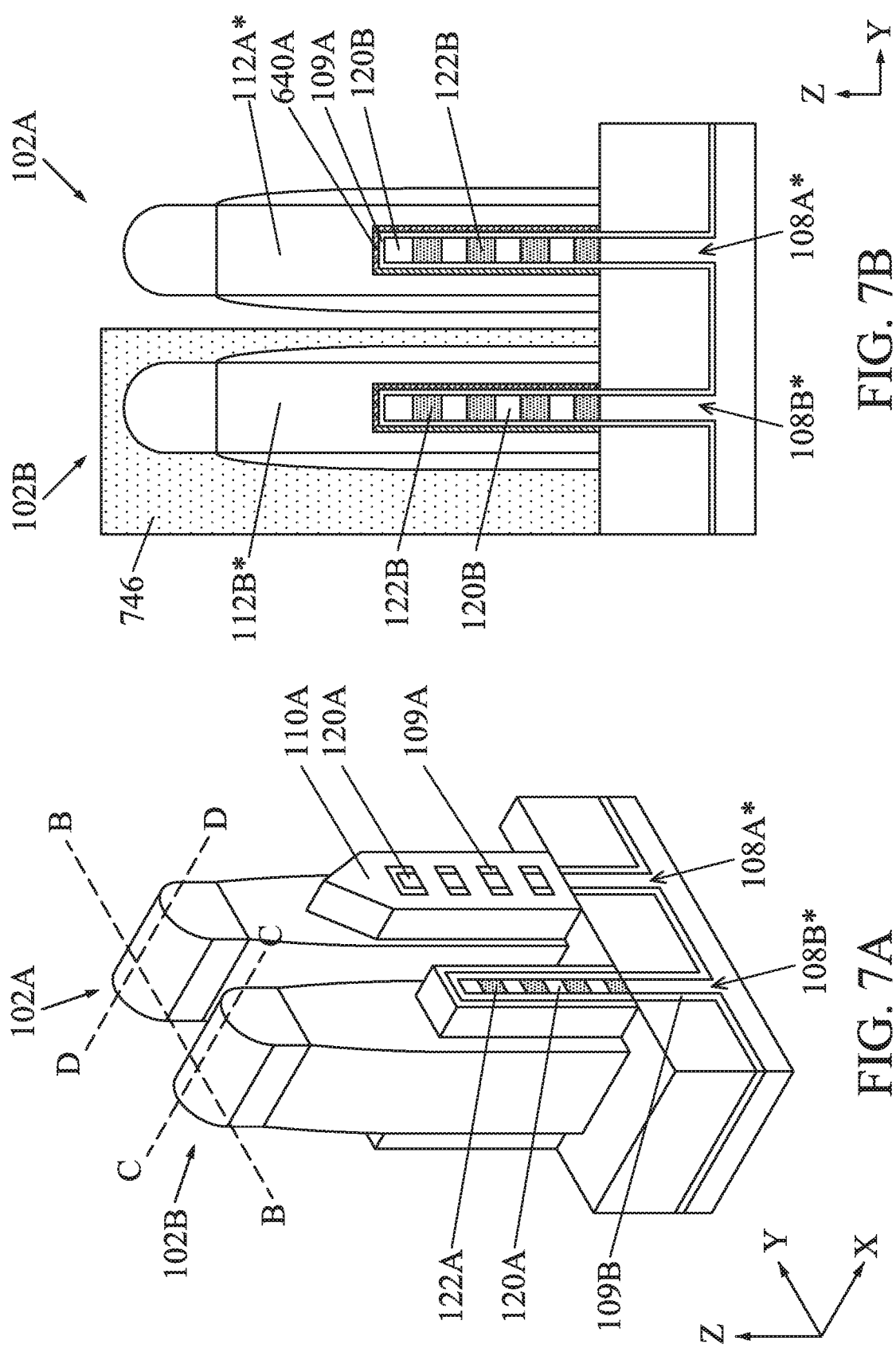

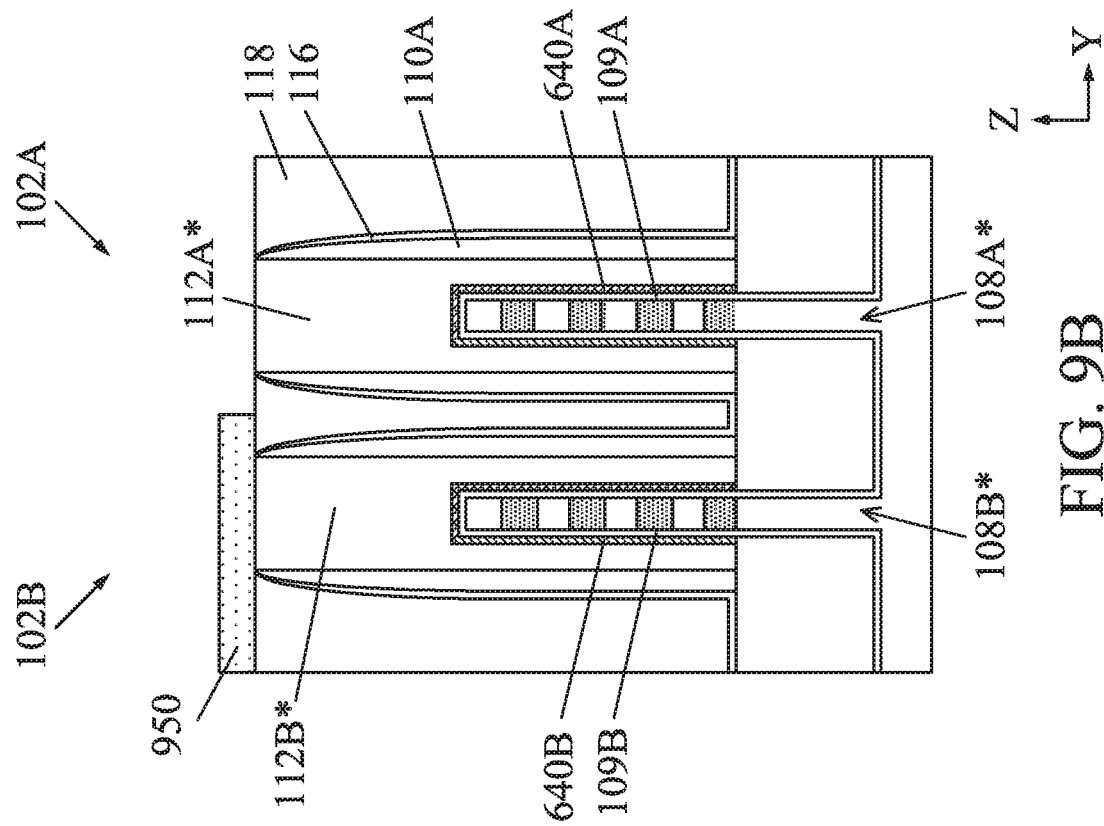
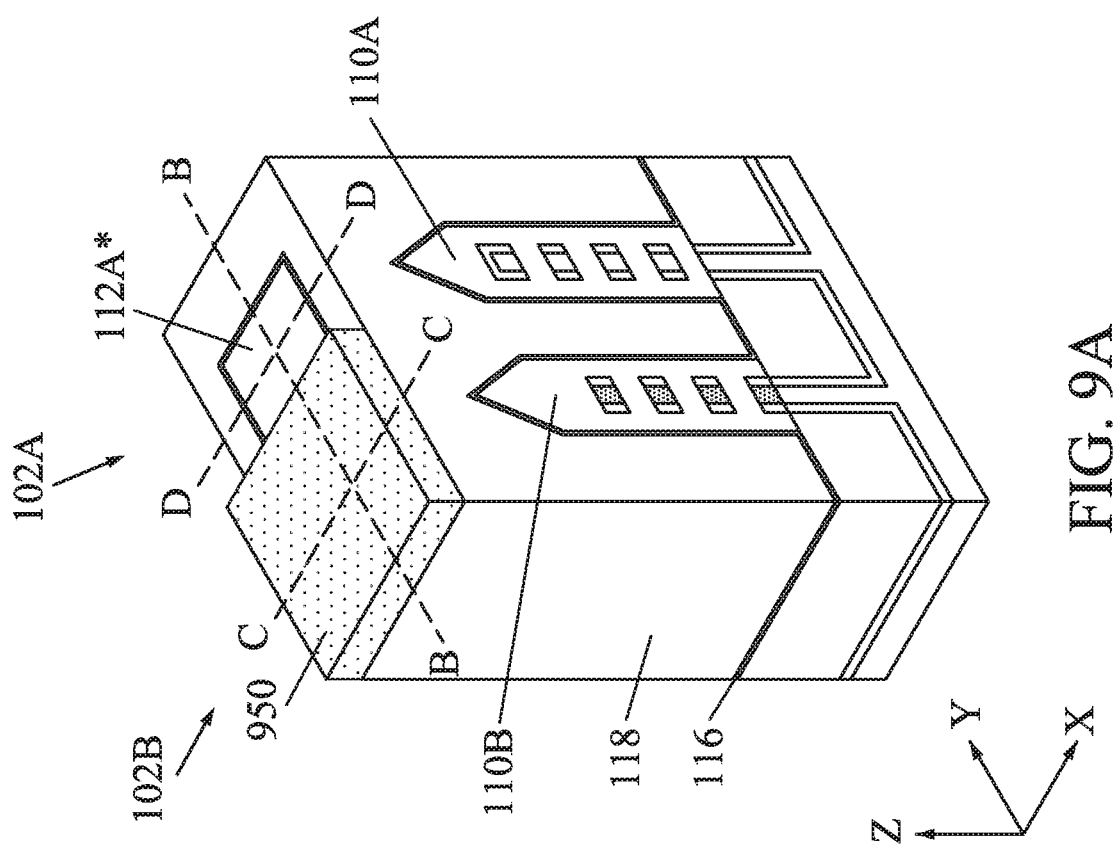
FIG. 9A
FIG. 9B

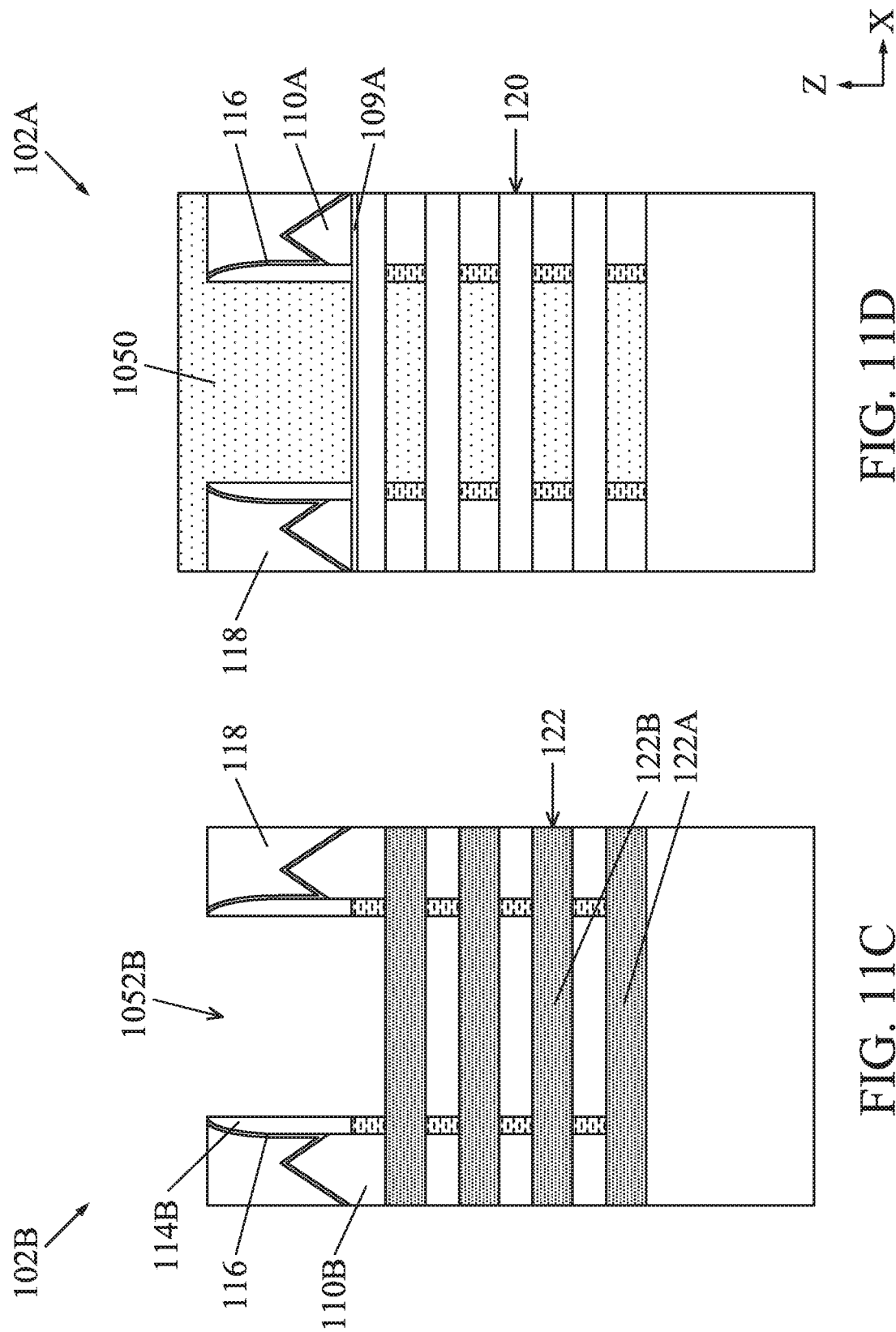

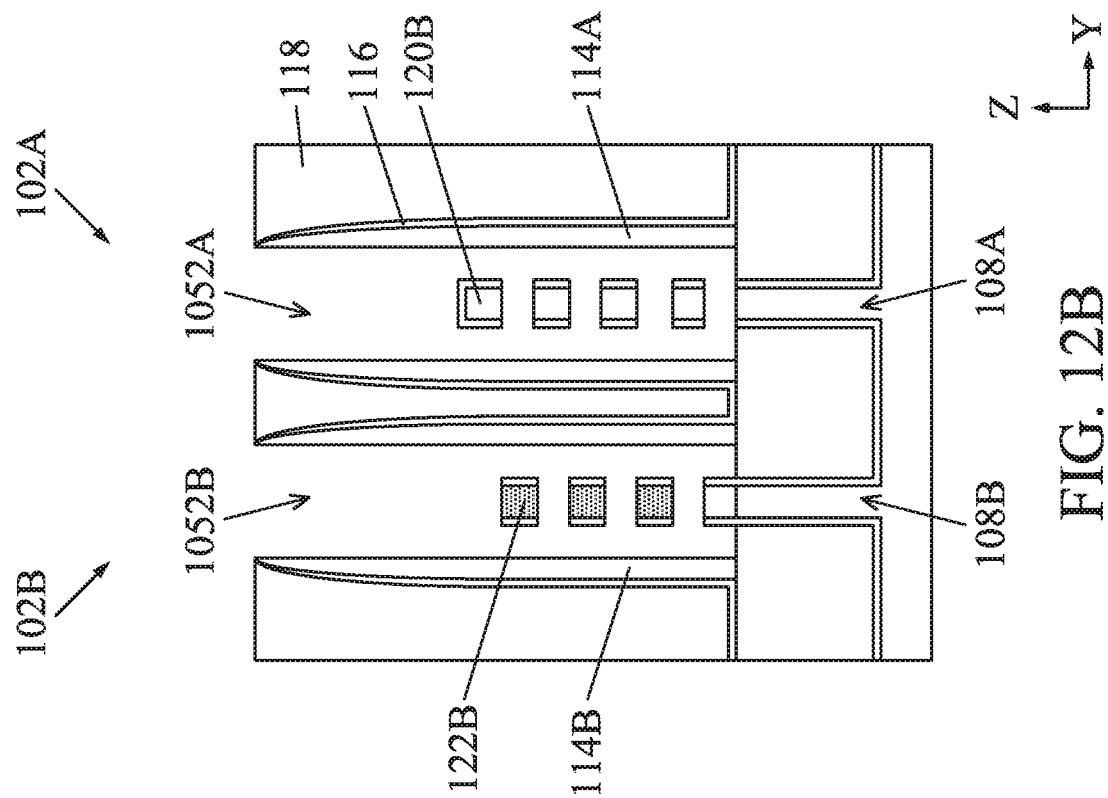
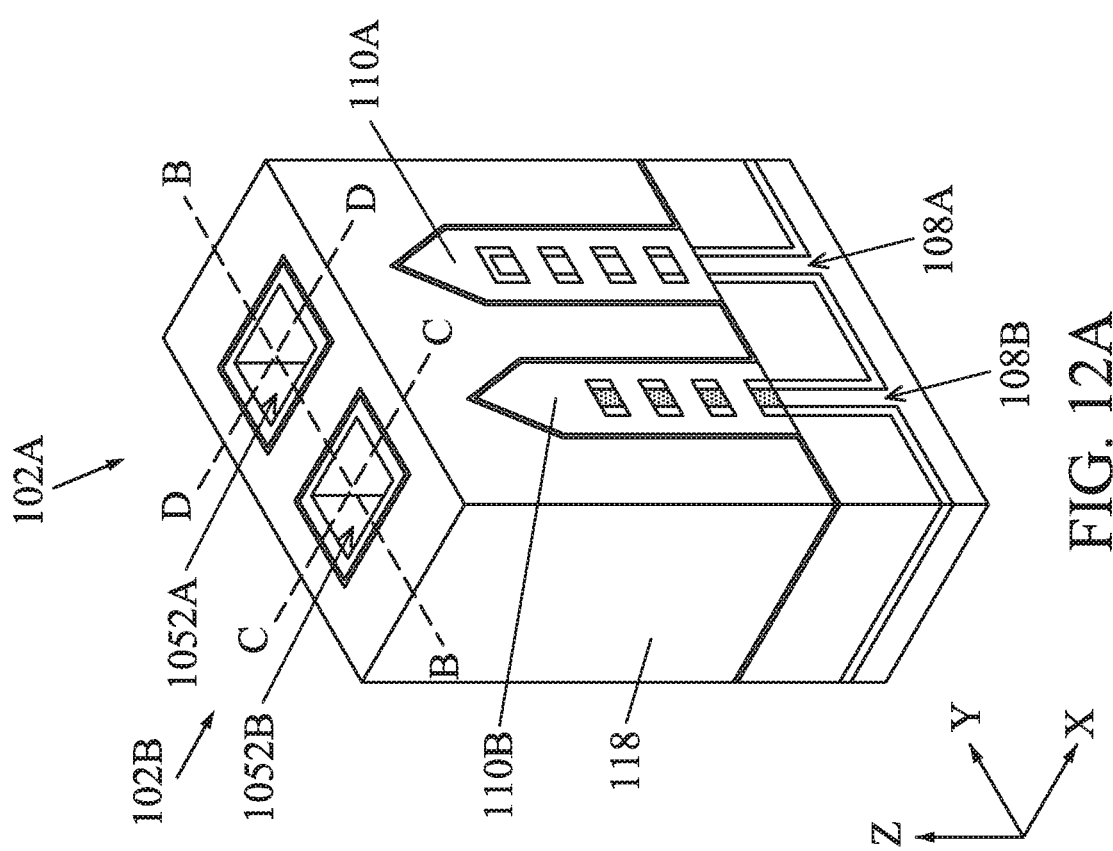
FIG. 12B
FIG. 12A

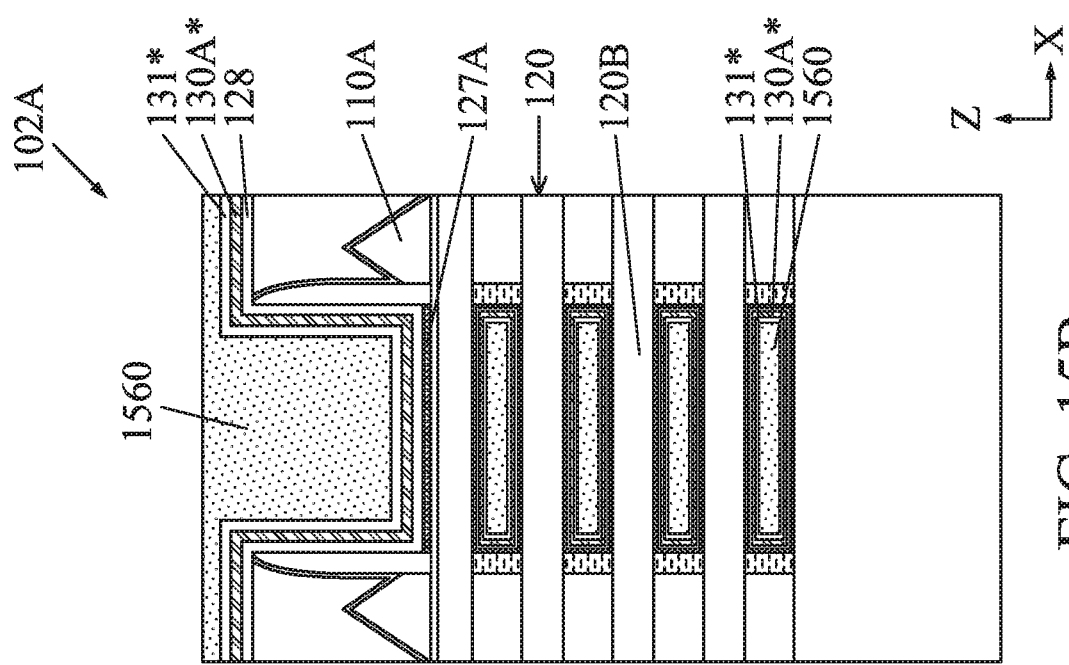
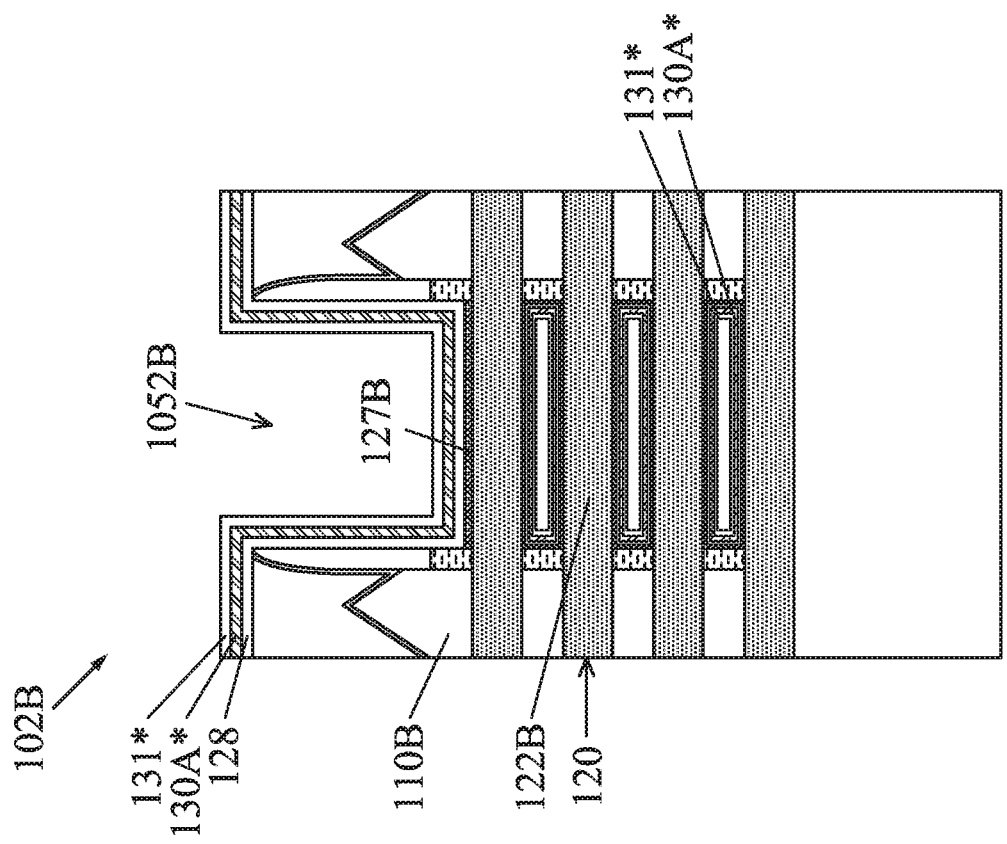
FIG. 15B
FIG. 15A

GATE STRUCTURES FOR SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 2A-2B illustrate cross-sectional views of different configurations of a semiconductor device, in accordance with some embodiments.

FIGS. 4A-12A illustrate isometric views of a semiconductor device with different gate structures at various stages of its fabrication process, in accordance with some embodiments.

FIGS. 4B-17B, 7C-12C, 7D-12D, and 13A-17A illustrate cross-sectional views of a semiconductor device with different gate structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
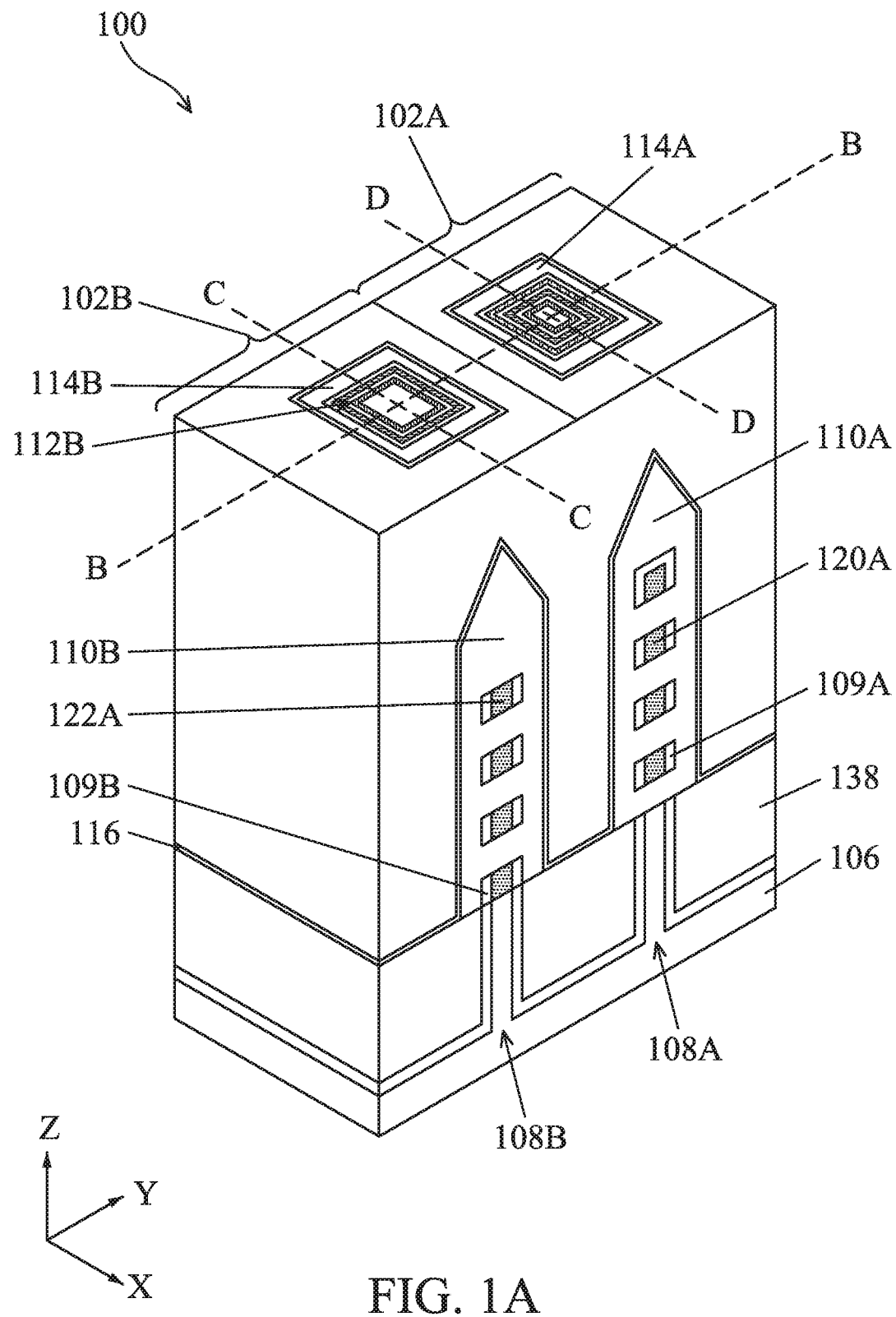
FIGS. 1A and 1B-1D illustrate an isometric view and cross-sectional views of a semiconductor device with different gate structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "deposition selectivity" refers to the ratio of the deposition rates on two different materials or surfaces under the same deposition conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "nanostructured" defines a structure, layer, and/or region as having a horizontal dimension (e.g., along an X- and/or Y-axis) and/or a vertical dimension (e.g., along a Z-axis) less than, for example, 100 nm.

As used herein, the term "n-type work function metal (nWFM)" defines a metal or a metal-containing material with a work function value closer to a conduction band energy than a valence band energy of a material of a FET channel region. In some embodiments, the term "n-type work function metal (nWFM)" defines a metal or a metal-containing material with a work function value less than 4.5 eV.

As used herein, the term "p-type work function metal (pWFM)" defines a metal or a metal-containing material with a work function value closer to a valence band energy than a conduction band energy of a material of a FET channel region. In some embodiments, the term "p-type work function metal (pWFM)" defines a metal or a metal-containing material with a work function value equal to or greater than 4.5 eV.

In some embodiments, the terms "about" and "substantially" can indicate a value of a given quantity that varies within 5% of the value (e.g., ±1%, ±2%, ±3%, ±4%, ±5% of the value).

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage Vt—to turn on a field effect transistor (FET) can depend on the semiconductor material of the FET channel region and the work function values of the stack of layers (also referred to as a "gate stack") included in a gate structure of the FET. For example, for an n-type FET (NFET), reducing the difference between the work function value of the NFET gate stack and the conduction band energy of the material (e.g., 4.1 eV for Si or 3.8 eV for SiGe) of the NFET channel region can reduce the NFET threshold voltage. For a p-type FET (PFET), reducing the difference between the work function value of the PFET gate stack and the valence band energy of the material (e.g., 5.2 eV for Si or 4.8 eV for SiGe) of the PFET channel region can reduce the PFET threshold voltage. The work function values of the FET gate stacks can depend on the thickness and/or material composition of each of the layers of the FET gate stacks. As such, FETs can be manufactured with different threshold voltages by adjusting the thickness and/or material composition of the gate stack layers.

Due to the increasing demand for low power portable devices, there is an increasing demand for FETs with low threshold voltages, such as threshold voltages lower than 100 mV (also referred to as "ultra-low threshold voltage"). One way to achieve such ultra-low threshold voltage in FETs can be by using work function metal (WFM) layer(s) with thickness greater than about 4 nm (e.g., about 5 nm to about 10 nm) in the gate stacks. However, the thickness of the WFM layer(s) in the gate stacks can be constrained by the gate stack geometries of the FETs. For example, in gate-all-around (GAA) FETs, the thickness of the WFM layer(s) can be constrained by the spacing between the nanostructured channel regions of the GAA FETs. Also, depositing such thick WFM layer(s) can become increasingly challenging with the continuous scaling down of FETs (e.g., GAA FETs).

The present disclosure provides example structures of FETs (e.g., finFETs or GAA FETs) with different gate structures configured to provide ultra-low threshold voltages and example methods of forming such FETs on a same substrate. The example methods form FETs of different conductivity types with different work function values, and as a result, with different and/or ultra-low threshold voltages on the same substrate. These example methods can be less complicated and more cost-effective in manufacturing reliable gate structures in FETs with nanostructured channel regions and with ultra-low threshold voltages than other methods of forming FETs with similar channel dimensions and threshold voltages on the same substrate. In addition, these example methods can form FET gate structures with smaller dimensions (e.g., thinner gate stacks) than other methods of forming FETs with similar threshold voltages. For example, using these example methods, the thicknesses of gate stack layers can be reduced by about 50% to about 75% compared to the thicknesses of gate stack layers formed using the other methods.

In some embodiments, NFETs and PFETs with different gate stack layer configurations can be selectively formed on the same substrate. To achieve NFETs and PFETs with ultra-low threshold voltages, NFETs and PFETs can include Al-based NFET gate stacks and substantially Al-free (e.g., with no Al) PFET gate stacks, respectively. The NFET and PFET gate stacks can have n-type WFM (nWFM) layer(s) and p-type WFM (pWFM) layer(s) in physical contact with gate dielectric layers of the NFETs and PFETs, respectively. The NFET gate stacks can include Al-based nWFM layers (e.g., Al-based titanium (Ti) or tantalum (Ta) alloys) and the PFET gate stacks can include substantially Al-free (e.g., with no Al) pWFM bi-layers (e.g., Al-free Ti and Ta nitrides or alloys) with thicknesses smaller than 3 nm (e.g., about 0.5 nm to about 3 nm) to achieve ultra-low threshold voltages. In some embodiments, TaN of the pWFM bi-layers can prevent underlying layers from being etched during subsequent processing (e.g., deposition of fluorine-free tungsten (FFW) layer) and protect the integrity of the pWFM layer(s), thus improving the reliability of PFET gate structures. In some embodiments, the reliability of the NFET gate structures can be improved with the selective formation of Si capping layers on the Al-based nWFM layers. The Si capping layers can prevent the oxidation of the Al-based nWFM layers and as a result, prevent an increase in work function values of the Al-based nWFM layers.

Figure 1B:
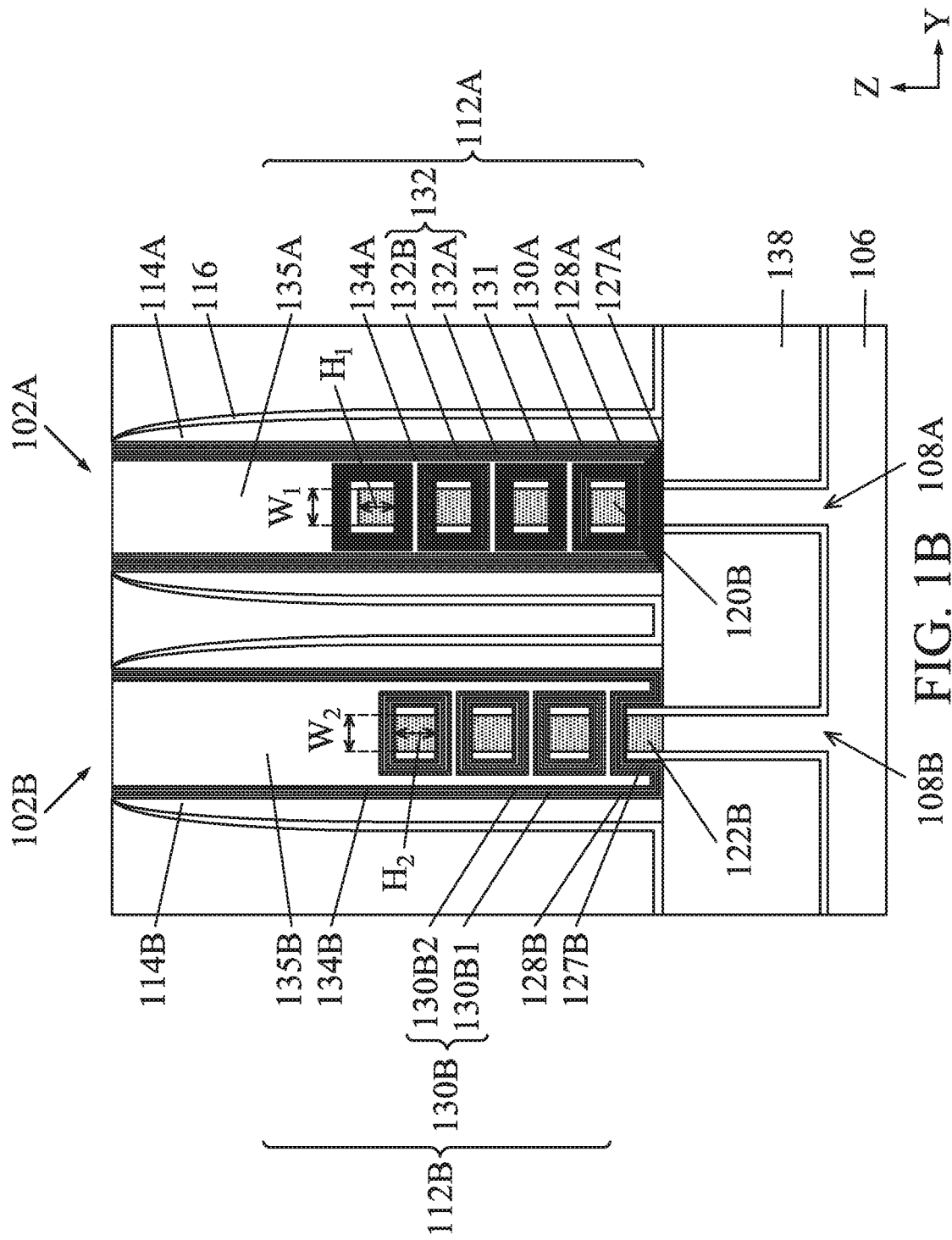
Figure 1C:
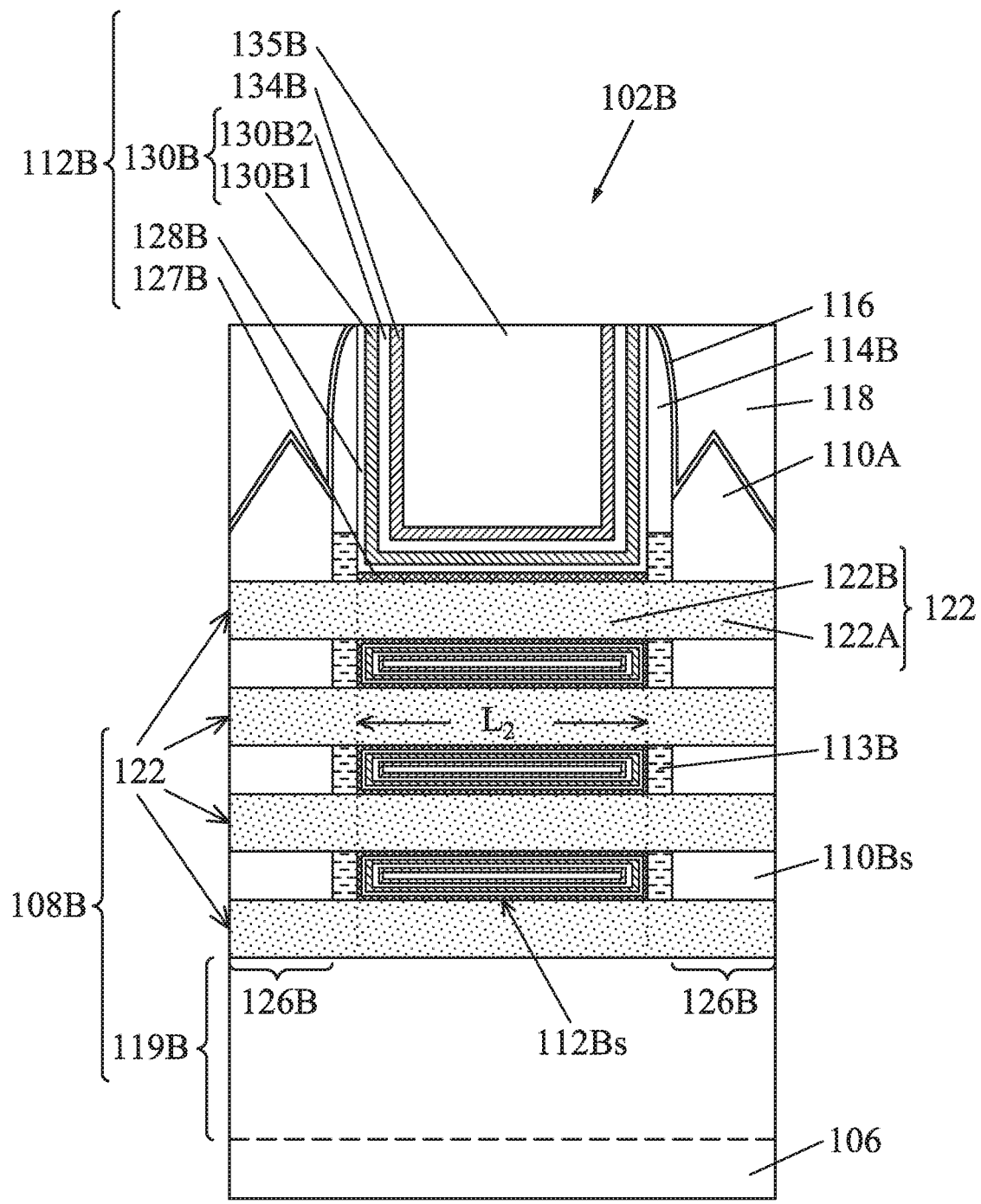
Figure 1D:
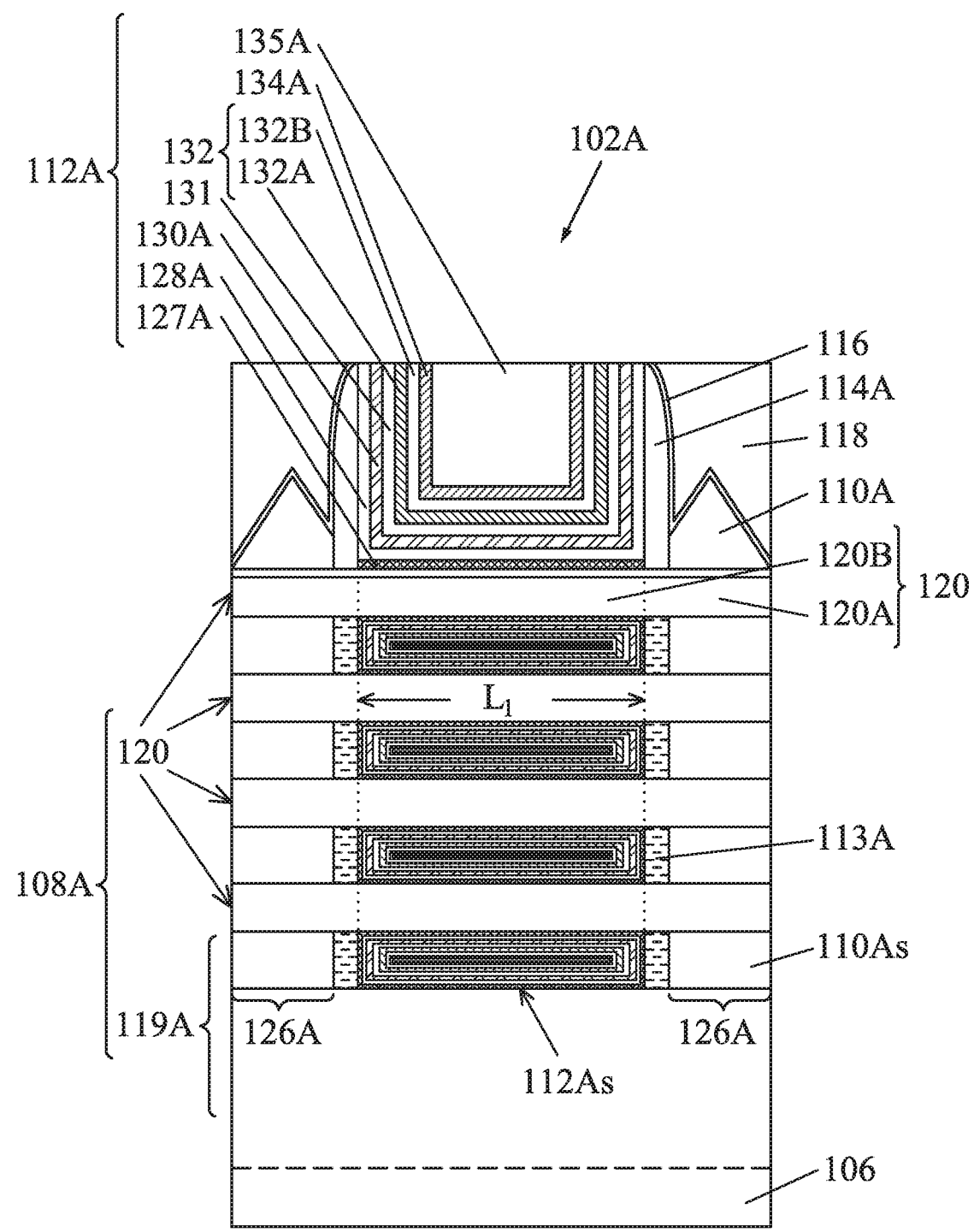

A semiconductor device 100 having FETs 102A-102B is described with reference to FIGS. 1A-1D, according to some embodiments. FIG. 1A illustrates an isometric view of semiconductor device 100, according to some embodiments. FIGS. 1B-1D illustrate cross-sectional views along lines B-B, C-C, and D-D of semiconductor device 100 of FIG. 1A, respectively, according to some embodiments. In some embodiments, FETs 102A-102B can be NFET and PFET, respectively. Even though two FETs are discussed with reference to FIGS. 1A-1D, semiconductor device 100 can have any number of FETs. The discussion of elements of FETs 102A-102B with the same annotations applies to each other, unless mentioned otherwise. The isometric view and cross-sectional views of semiconductor device 100 are shown for illustration purposes and may not be drawn to scale.

Referring to FIGS. 1A-1D, FETs 102A-102B can be formed on a substrate 106. Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

FETs 102A-102B can include fin structures 108A-108B, passivation layers 109A-109B, epitaxial fin regions 110A-110B, gate structures 112A-112B (also referred to as "gate-all-around (GAA) structures 112A-112B"), inner spacers 113A-113B, and outer spacers 114A-114B, respectively.

As shown in FIGS. 1B-1D, fin structure 108A can include a fin base portion 119A and a stack of first semiconductor layers 120 disposed on fin base portion 119A and fin structure 108B can include a fin base portion 119B and a stack of second semiconductor layers 122. In some embodiments, fin base portions 119A-119B can include material similar to substrate 106. Fin base portions 119A-119B can be formed from photolithographic patterning and etching of substrate 106. First and second semiconductor layers 120 and 122 can include semiconductor materials different from each other. In some embodiments, first and second semiconductor layers 120 and 122 can include semiconductor materials with oxidation rates and/or etch selectivity different from each other. In some embodiments, first and second semiconductor layers 120 and 122 can include semiconductor materials similar to or different from substrate 106. First and second semiconductor layers 120 and 122 can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof.

In some embodiments, first and second semiconductor layers 120 and 122 can include SiGe with Ge in a range from about 25 atomic percent to about 50 atomic percent with any remaining atomic percent being Si or can include Si without any substantial amount of Ge (e.g., with no Ge). The semiconductor materials of first and/or second semiconductor layers 120 and 122 can be undoped or can be in-situ doped during their epitaxial growth process using: (i) p-type dopants, such as boron, indium, or gallium; and/or (ii) n-type dopants, such as phosphorus or arsenic. In some embodiments, first semiconductor layers 120 can include Si, SiAs, silicon phosphide (SiP), SiC, or silicon carbon phosphide (SiCP) for n-type FET 102A and second semiconductor layers 122 can include SiGe, silicon germanium boron (SiGeB), germanium boron (GeB), silicon germanium stannum boron (SiGeSnB), or a III-V semiconductor compound for p-type FET 102A. In some embodiments, both first and semiconductor layers 120 and 122 can include Si, SiAs, SiP, SiC, or SiCP for n-type FETs 102A-102B or SiGe, SiGeB, GeB, SiGeSnB or a III-V semiconductor compound for p-type FETs 102A-102B. In some embodiments, first and second semiconductor layers 120 and 122 can include materials similar to each other for NFET and PFET 102A-102B.

Each of first semiconductor layers 120 can have (i) nanostructured regions 120A wrapped around by epitaxial fin regions 110A and underlying inner and outer spacers 113A-114A (FIGS. 1A and 1D), and (ii) nanostructured channel regions 120B wrapped around by gate structure 112A (FIGS. 1B and 1D). Similarly, each of second semiconductor layers 122 can have (i) nanostructured regions 122A wrapped around by epitaxial fin regions 110B and underlying inner and outer spacers 113B-114B (FIGS. 1A and 1C), and (ii) nanostructured channel regions 122B wrapped around by gate structure 112B (FIGS. 1B and 1C).

Referring to FIG. 1B, nanostructured channel regions 120B and 122B can have respective vertical dimensions $H_1$ and $H_2$ (e.g., thickness or diameter) along a Z-axis ranging from about 5 nm to about 12 nm and respective horizontal dimensions $W_1$ and $W_2$ (e.g., width or diameter) along a Y-axis ranging from about 5 nm to about 30 nm. The ratios of $H_1/W_1$ and $H_2/W_2$ can each range from about 0.2 to about 5. Though rectangular cross-sections of nanostructured channel regions 120B and 122B are shown in FIG. 1B, nanostructured channel regions 120B and 122B can have cross-sections of other geometric shapes (e.g., circular, elliptical, triangular, or polygonal). Further, nanostructured channel regions 120B and 122B can have respective horizontal dimensions $L_1$ (FIG. 1D) and $L_2$ (FIG. 1C) along an X-axis ranging from about 10 nm to about 100 nm. The ratios of $L_1/H_1$ and $L_2/H_2$ can range from about 2 to about 20. In some embodiments, dimensions $H_1$ and $H_2$, $W_1$ and $W_2$, and $L_1$ and $L_2$ can be equal to or different from each other, respectively. In some embodiments, the ratios of $W/W_1$ and $H_2/W_2$, and $L_1/H_1$ and $L_2/H_2$ can be equal to or different from each other, respectively.

Referring to FIGS. 1A-1B, passivation layers 109A-109B can be disposed on sidewalls of nanostructured channel regions 120B and 122B and on sidewalls of fin base portions 119A and 119B, respectively. In some embodiments, passivation layer 109A can be disposed on top surface of the top most nanostructured channel region 120B, as shown in FIG. 1D. In some embodiments, passivation layers 109A-109B can be a nitride, oxide, fluoride, chloride, and/or sulfide film.

Referring to FIGS. 1A and 1C-1D, epitaxial fin regions 110A can be grown wrapped around nanostructured regions 120A that are not under inner or outer spacers 113A-114A. Similarly, epitaxial fin regions 110B can be grown wrapped around nanostructured regions 122A that are not under inner or outer spacers 113B-114B. In some embodiment, as shown in FIGS. 2A-2B, epitaxial fin regions 110B-110A can be grown on fin base portions 119B-119A, instead of being wrapped around nanostructured regions 122A and 120A, respectively. Epitaxial fin regions 110A-110B can include epitaxially-grown semiconductor materials similar to or different from each other. In some embodiments, the epitaxially-grown semiconductor material can include the same material or a different material from the material of substrate 106. Epitaxial fin regions 110A-110B can each have a thickness along sidewalls of respective nanostructured regions 120A and 122A ranging from about 3 nm to about 6 nm. Though triangular cross-sections of epitaxial fin regions 110A-110B are shown in FIGS. 1C-1D, epitaxial fin regions 110A-110B can have cross-sections of other geometric shapes (e.g., rectangular, semicircular, or polygonal).

Epitaxial fin regions 110A-110B can be n- and p-type, respectively. P-type epitaxial fin regions 110B can include SiGe, SiGeB, GeB, SiGeSnB, a III-V semiconductor compound, or a combination thereof and a dopant concentration ranging from about $1 \times 10^{20}$ atoms/cm$^3$ to about $1 \times 10^{21}$ atoms/cm$^3$. In some embodiments, each of p-type epitaxial fin regions 110B can have a plurality of sub-regions (not shown) that can include SiGe and can differ from each other based on, for example, doping concentration, epitaxial growth process conditions and/or relative concentration of Ge with respect to Si. Each of the sub-regions can have thicknesses similar to or different from each other and thicknesses can range from about 0.5 nm to about 5 nm. In some embodiments, the atomic percent Ge in a first sub-region can be smaller than the atomic percent Ge in a second sub-region. In some embodiments, the first sub-region can include Ge in a range from about 15 atomic percent to about 35 atomic percent, while the second sub-region can include Ge in a range from about 25 atomic percent to about 50 atomic percent with any remaining atomic percent being Si in the sub-regions.

The plurality of sub-regions of p-type epitaxial fin regions 110B can have varying p-type dopant concentrations with respect to each other, according to some embodiments. For example, the first sub-region can be undoped or can have a dopant concentration lower (e.g., dopant concentration less than about $8 \times 10^{20}$ atoms/cm$^3$) than the dopant concentration (e.g., dopant concentration in a range from about $1 \times 10^{20}$ to about $3 \times 10^{22}$ atoms/cm$^3$) of the second sub-region.

In some embodiments, n-type epitaxial fin regions 110A can have a plurality of n-type sub-regions (not shown). First n-type sub-regions can have materials with SiAs, SiC, or SiCP, a dopant concentration ranging from about $1 \times 10^{20}$ atoms/cm$^3$ to about $1 \times 10^{21}$ atoms/cm$^3$ and a thickness ranging from about 1 nm to about 3 nm. Second n-type sub-regions disposed on the first n-type sub-regions can have materials with SiP and a dopant concentration ranging from about $1 \times 10^{20}$ atoms/cm$^3$ to about $1 \times 10^{22}$ atoms/cm$^3$. Third n-type sub-regions disposed on the second n-type sub-regions can have materials with material compositions and thicknesses similar to the first n-type sub-regions.

Epitaxial fin regions 110A-110B along with their underlying nanostructured regions 120A and 122A can form source/drain (S/D) regions 126A-126B, respectively. In some embodiments, epitaxial fin regions 110A-110B as shown in FIGS. 2B-2A can form S/D regions 126A-126B, respectively. Nanostructured channel regions 120B and 122B can be interposed between a pair of S/D regions 126A-126B, respectively, as shown in FIGS. 1C-1D and 2A-2B.

Gate structures 112A-112B can be multi-layered structures and can be wrapped around nanostructured channel regions 120B and 122B, respectively, for which gate structures 112A-112B can be referred to as "gate-all-around (GAA) structures" or "horizontal gate-all-around (HGAA) structures," and FETs 102A-102B can be referred to as "GAA FETs 102A-102B" or "GAA NFET and PFET 102A-102B," respectively.

Gate structures 112A-112B can include interfacial oxide layers 127A-127B, gate dielectric layers 128A-128B, gate WFM layers 130A-130B, fluorine blocking layers 134A-134B, and gate metal fill layers 135A-135B, respectively. Gate structure 112A can further include capping layers 131-132. Even though FIG. 1B shows that all the layers of gate structures 112A-112B are wrapped around nanostructured channel regions 120B and 122B, respectively, nanostructured channel regions 120B and 122B can be wrapped around by at least interfacial oxide layers 127A-127B and gate dielectric layers 128A-128B to fill the spaces between adjacent nanostructured channel regions 120B and 122B, and thus electrically isolate nanostructured channel regions 120B and 122B from each other, respectively, to prevent shorting between gate structures 112A-112B and S/D regions 126A-126B during operation of FETs 102A-102B, respectively. In some embodiments, instead of all the layers of gate structures 112A-112B being wrapped around nanostructured channel regions 120B and 122B, respectively, nanostructured channel regions 120B and 122B can be wrapped around by at least interfacial oxide layers 127A-127B, gate dielectric layers 128A-128B, gate WFM layers 130A-130B to fill the spaces between adjacent nanostructured channel regions 120B and 122B to achieve ultra-low threshold voltage for FETs 102A-102B, respectively.

Each of interfacial oxide layers 127A-127B can be disposed on respective nanostructured channel regions 120B and 122B and can include silicon oxide and a thickness ranging from about 0.5 nm to about 1.5 nm. Each of gate dielectric layers 128A-128B can have a thickness (e.g., about 1 nm to about 3 nm) that is about 2 to 3 times the thickness of interfacial oxide layers 127A-127B and can include (i) a layer of silicon oxide, silicon nitride, and/or silicon oxynitride, (ii) a high-k dielectric material, such as hafnium oxide (HfO$_2$), titanium oxide (TiO$_2$), hafnium zirconium oxide (HfZrO), tantalum oxide (Ta$_2$O$_3$), hafnium silicate (HfSiO$_4$), zirconium oxide (ZrO$_2$), zirconium silicate (ZrSiO$_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof.

Referring to FIGS. 1B-1D, in some embodiments, WFM layers 130A-130B can be disposed on and in physical contact with gate dielectric layers 128A-128B and can include nWFM and pWFM layers for NFET 102A and PFET 102B, respectively. The nWFM layers can include a metallic material with a work function value closer to a conduction band energy than a valence band energy of a material of nanostructured channel regions 120B. For example, the nWFM layers can include an Al-based or Al-doped metallic material with a work function value less than 4.5 eV (e.g., about 3.5 eV to about 4.4 eV), which can be closer to the conduction band energy (e.g., 4.1 eV of Si or 3.8 eV of SiGe) than the valence band energy (e.g., 5.2 eV of Si or 4.8 eV of SiGe) of Si-based or SiGe-based nanostructured channel regions 120B, respectively. In some embodiments, the nWFM layers can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or a combination thereof. In some embodiments, each of the nWFM layers can include a thickness ranging from about 1 nm to about 3 nm. The thickness within this range can allow the nWFM layers to be wrapped around nanostructured channel regions 120B for ultra-low threshold voltage of NFET 102A without being constrained by the spacing between adjacent nanostructured channel regions 120B.

Each of WFM layers 130B can include bi-layers of pWFM layers 130B1-130B2, which are different from each other in material and/or structural composition. Either or both of pWFM layers 130B1-130B2 can include a metallic material with a work function value closer to a valence band-edge energy than a conduction band-edge energy of a material of nanostructured channel regions 122B. For example, either or both of pWFM layers 130B1-130B2 can include a substantially Al-free (e.g., with no Al) metallic material with a work function value equal to or greater than 4.5 eV (e.g., about 4.5 eV to about 5.5 eV), which can be closer to the valence band-edge energy (e.g., 5.2 eV of Si or 4.8 eV of SiGe) than the conduction band-edge energy (e.g., 4.1 eV of Si or 3.8 eV of SiGe) of Si-based or SiGe-based nanostructured channel regions 122B, respectively.

In some embodiments, pWFM layers 130B1 can include substantially Al-free (e.g., with no Al) (i) Ti-based nitrides or alloys, such as TiN, TiSiN, titanium gold (Ti—Au) alloy, titanium copper (Ti—Cu) alloy, titanium chromium (Ti—Cr) alloy, titanium cobalt (Ti—Co) alloy, titanium molybdenum (Ti—Mo) alloy, or titanium nickel (Ti—Ni) alloy; (ii) Ta-based nitrides or alloys, such as TaN, TaSiN, Ta—Au alloy, Ta—Cu alloy, Ta—W alloy, tantalum platinum (Ta—Pt) alloy, Ta—Mo alloy, Ta—Ti alloy, or Ta—Ni alloy; or (iii) a combination thereof.

In some embodiments, pWFM layers 130B2 can be configured to prevent etching of pWFM layers 130B1 by precursors (e.g., tungsten chloride) used during deposition of overlying fluorine blocking layers 134B (e.g., FFW). In some embodiments, pWFM layers 130B2 can include substantially Al-free (e.g., with no Al) (i) Ta-based nitrides, such as TaN or TaSiN; (ii) W-based nitrides, such as WN or WCN; or (iii) a combination thereof. In some embodiments, each of pWFM layers 130B1-130B2 can include a thickness ranging from about 1 nm to about 3 nm. The thickness within this range can allow pWFM layers 130B1-130B2 to be wrapped around nanostructured channel regions 120B for ultra-low threshold voltage of PFET 102B without being constrained by the spacing between adjacent nanostructured channel regions 122B.

Referring to FIGS. 1B-1D, capping layers 131-132 can be selectively formed on WFM layers 130A and not on WFM layers 130B. In some embodiments, capping layers 131 can include Si-based layers and capping layers 132 can include bi-layers of Ti- and/or Ta-based capping layers 132A and Ta- and/or W-based capping layers 132B. Either or both capping layers 131 and 132A can be configured to prevent the oxidation of WFM layers 130A (e.g., Al-based or Al-doped layers) during the processing of gate structures 112A-112B. WFM layers 130A are prevented from being oxidized because oxidized WFM layers 130A (e.g., aluminum oxide-based layers) can have work function values closer to the valence band-edge energy (e.g., 5.2 eV of Si or 4.8 eV of SiGe) than the conduction band-edge energy (e.g., 4.1 eV of Si or 3.8 eV of SiGe) of Si-based or SiGe-based nanostructured channel regions 120B, respectively, and as a result, increase the threshold voltage of NFET 102A.

Similar to pWFM layers 130B2, capping layers 132B can be configured to prevent etching of underlying capping layers 132A by precursors (e.g., tungsten chloride) used during deposition of overlying fluorine blocking layers 134B (e.g., FFW). In some embodiments, the material and/or structural composition of capping layers 132A-132B can be similar to that of pWFM layers 130B1-130B2 and can be simultaneously formed with pWFM layers 130B1-130B2.

In some embodiments, fluorine blocking layers 134A-134B can be disposed between gate metal fill layers 135A and capping layers 132 and between gate metal fill layers 135B and WFM layers 130B, respectively. Fluorine blocking layers 134A-134B can prevent any substantial diffusion of fluorine (e.g., no fluorine diffusion) from fluorine-based precursors used during the deposition of overlying gate metal fill layers 135A-135B to underlying layers capping layers 132 and WFM layers 130B, respectively. In some embodiments, fluorine blocking layers 134A-134B can include substantially fluorine-free metal layers (e.g., FFW layers). The substantially fluorine-free metal layers can include an amount of fluorine contaminants less than about 5 atomic percent in the form of ions, atoms, and/or molecules. In some embodiments, fluorine blocking layers 134A-134B can each have a thickness ranging from about 2 nm to about 4 nm for effective blocking of fluorine diffusion from gate metal fill layers 135A-135B to capping layers 132 and WFM layers 130B, respectively.

Each of gate metal fill layers 135A-135B can include a single metal layer or a stack of metal layers. The stack of metal layers can include metals different from each other. In some embodiments, each of gate metal fill layers 135A-135B can include a suitable conductive material, such as W, Ti, Ag, ruthenium (Ru), Mo, Cu, cobalt (Co), Ni, metal alloys, and/or combinations thereof. Though gate structures 112A-112B are shown to have GAA structures, other gate structures (e.g., vertical GAA structures or gate structures without GAA structures) are within the scope and spirit of this disclosure.

Each of inner spacers 113A can be disposed between a sub-region 110As of epitaxial regions 110A and a sub-region 112As of gate structure 112A and each of inner spacers 113B can be disposed between a sub-region 110Bs of epitaxial regions 110B and a sub-region 112Bs of gate structure 112B. Each of inner spacers 113A-113B can prevent capacitive coupling between sub-regions 110As and 112As and between sub-regions 110Bs and 112Bs, respectively. Preventing capacitive coupling between these sub-regions can reduce parasitic capacitance between S/D regions 126A-126B and gate structures 112A-112B and improve device performance of FETs 102A-102B.

In some embodiments, inner spacers 113A-113B can include a low-k dielectric material with a dielectric constant less than about 3.9 and/or between about 1 to about 3.5. In some embodiments, the low-k dielectric material can include silicon oxycarbonitride (SiOCN), silicon carbon nitride (SiCN), silicon oxide carbide (SiOC), polymides, carbon-doped oxides, fluorine-doped oxides, hydrogen-doped oxides, or a combination thereof. In some embodiments, inner spacers 113A-113B can have material similar to or different from each other. In some embodiments, both FETs 102A-102B can have inner spacers, such as inner spacers 113A-113B or one of FETs 102A-102B can have inner spacers, such as inner spacers 113A or 113B. Though rectangular cross-sections of inner spacers 113A-113B are shown in FIGS. 1C-1D, inner spacers 113A-113B can have cross-sections of other geometric shapes (e.g., semicircular, triangular, or polygonal). In some embodiments, each of inner spacers 113A-113B can have a horizontal dimension along an X-axis ranging from about 3 nm to about 15 nm.

Outer spacers 114A-114B can be disposed on sidewalls of respective gate structures 112A-112B and be in physical contact with respective gate dielectric layers 128A-128B, according to some embodiments. Outer spacers 114A-114B can include an insulating material, such as silicon oxide, silicon nitride, silicon carbon nitride (SiCN), silicon oxycarbon nitride (SiOCN), a low-k material, or a combination thereof. Outer spacers 114A-114B can have a low-k material with a dielectric constant less than about 3.9 and/or between about 1 to about 3.5. In some embodiments, each of outer spacers 114A-114B can have a thickness ranging from about 2 nm to about 10 nm. In some embodiments, a horizontal distance between outer spacers 114A along an X-axis is greater than a horizontal distance between inner spacers 113A along an X-axis. Similarly, a horizontal distance between outer spacers 114B along an X-axis is greater than a horizontal distance between inner spacers 113B along an X-axis.

FETs 102A-102B can be incorporated into an integrated circuit through the use of other structural components, such as gate contact structures, S/D contact structures, conductive vias, conductive lines, interconnect metal layers, etc., which are not shown herein for the sake of clarity.

Referring to FIGS. 1A-1D, semiconductor device 100 can further include etch stop layer (ESL) 116, interlayer dielectric (ILD) layer 118, and shallow trench isolation (STI) regions 138. ESL 116 can be disposed on sidewalls of outer spacers 114A-114B and on epitaxial regions 110A-110B. ESL 116 can be configured to protect gate structures 112A-112B and/or S/D regions 126A-126B. This protection can be provided, for example, during the formation of ILD layer 118 and/or S/D contact structures (not shown). In some embodiments, ESL 116 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 116 can have a thickness ranging from about 3 nm to about 30 nm.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material is silicon oxide. In some embodiments, ILD layer 118 can have a thickness in a range from about 50 nm to about 200 nm.

STI regions 138 can be configured to provide electrical isolation between FETs 102A-102B and neighboring FETs (not shown) on substrate 106 and/or neighboring active and passive elements (not shown) integrated with or deposited on substrate 106. In some embodiments, STI regions 138 can include a plurality of layers, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials. In some embodiments, STI regions 138 can have a vertical dimension along a Z-axis ranging from about 40 nm to about 200 nm.

The cross-sectional shapes of semiconductor device 100 and its elements (e.g., fin structure 108A-108B, gate structures 112A-112B, epitaxial fin regions 110A-110B, inner spacers 113-113B, outer spacers 114A-114B, and/or STI regions 138) are illustrative and are not intended to be limiting.

Figure 3:
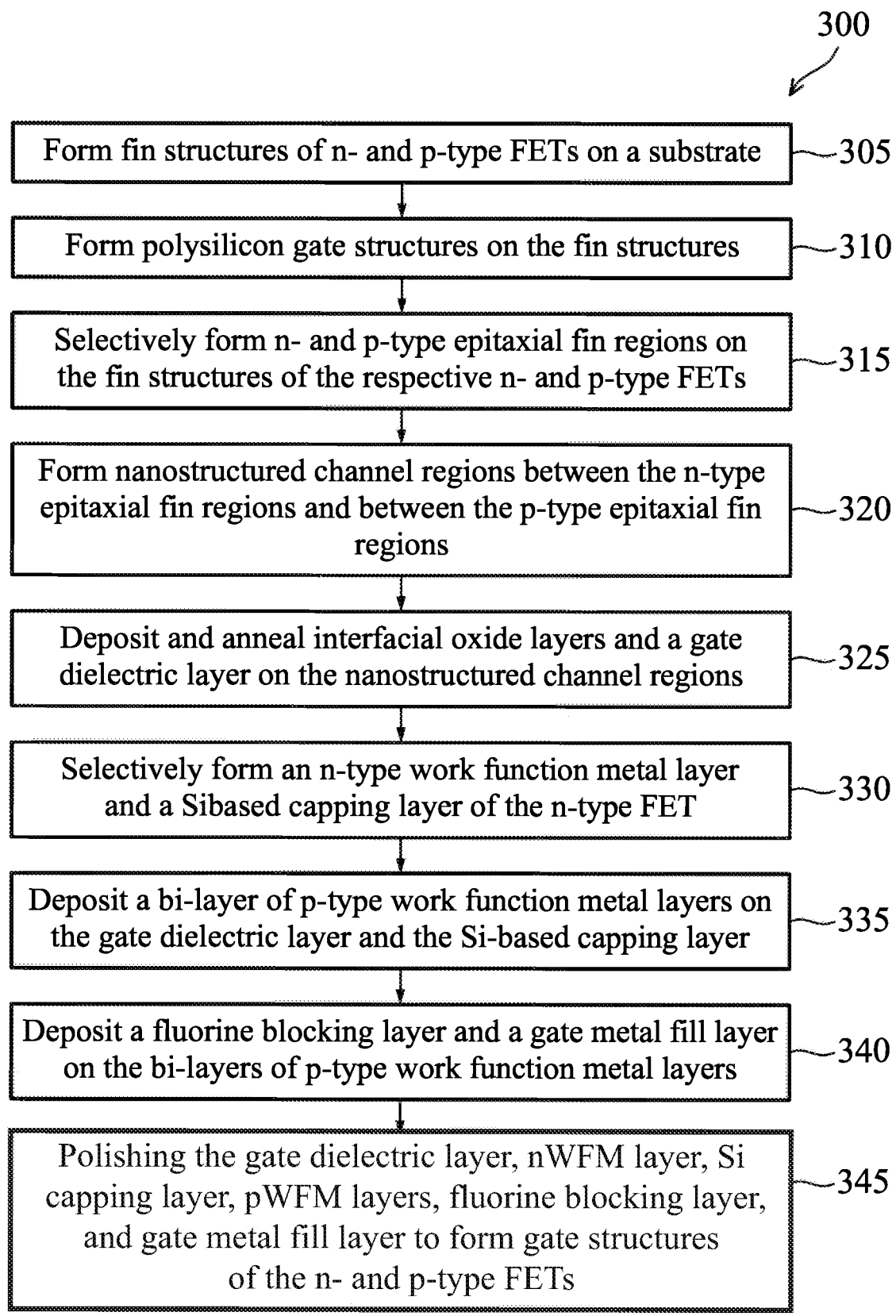
FIG. 3 is a flow diagram of a method for fabricating a semiconductor device with different gate structures, in accordance with some embodiments.

FIG. 3 is a flow diagram of an example method 300 for fabricating semiconductor device 100, according to some embodiments. For illustrative purposes, the operations illustrated in FIG. 300 will be described with reference to the example fabrication process for fabricating semiconductor device 300 as illustrated in FIGS. 4A-17A, 4B-17B, 7C-12C, and 7D-12D. FIGS. 4A-12A are isometric views of semiconductor device 100 at various stages of its fabrication. FIGS. 4B-12B are cross-sectional views along lines B-B of structures of FIGS. 4A-12A, respectively, according to some embodiments. FIGS. 7C-12C and 7D-12D are cross-sectional views along lines C-C and D-D of structures of FIGS. 7A-12A, respectively, according to some embodiments. FIGS. 13A-17A and 13B-17B are cross-sectional views along lines C-C and D-D, respectively, of semiconductor device 100 at various stages of fabrication of gate structures 112A-112B following the formation of the structure of FIG. 12A, according to some embodiments. Operations can be performed in a different order or not performed depending on specific applications. It should be noted that method 300 may not produce a complete semiconductor device 100. Accordingly, it is understood that additional processes can be provided before, during, and after method 300, and that some other processes may only be briefly described herein. Elements in FIGS. 4A-17A, 4B-17B, 7C-12C, and 7D-12D with the same annotations as elements in FIGS. 1A-1D are described above.

In operation 305, fin structures of an NFET and a PFET are formed on a substrate. For example, fin structures 108A*-108B* (shown in FIGS. 5A-5B) with fin base portions 119A-119B and stacks of first and second semiconductor layers 120 and 122 arranged in alternating configurations can be formed on substrate 106 as described with reference to FIGS. 4A-5B. In subsequent processing, fin structures 108A*-108B* can form fin structures 108A-108B (shown in FIGS. 1A-1D) after the removal of second and first semiconductor layers 122 and 120 from fin structures 108A*-108B*, respectively. The process for forming fin structures 108A*-108B* can include forming a stacked layer 108* on substrate 106 as shown in FIGS. 4A-4B. Stacked layer 108* can include first and second semiconductor layers 120* and 122* stacked in an alternating configuration. First and second semiconductor layers 120* and 122* can have respective vertical dimensions $H_1$ and $H_2$ along a Z-axis ranging from about 5 nm to about 30 nm.

Each of first and second semiconductor layers 120* and 122* can be epitaxially grown on its underlying layer and can include semiconductor materials different from each other. In some embodiments, first and second semiconductor layers 120* and 122* can include semiconductor materials with oxidation rates and/or etch selectivity different from each other. In some embodiments, first and second semiconductor layers 120* and 122* can include semiconductor materials similar to or different from substrate 106. First and second semiconductor layers 120* and 122* can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof. In some embodiments, first semiconductor layers 120* can include Si and second semiconductor layers 122* can include SiGe. In some embodiments, first and second semiconductor layers 120* and 122* can include SiGe with Ge in a range from about 25 atomic percent to about 50 atomic percent with any remaining atomic percent being Si or can include Si without any substantial amount of Ge (e.g., with no Ge).

First and/or second semiconductor layers 120* and 122* can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used.

The process for forming fin structures 108A*-108B* can further include etching the structure of FIG. 4A through patterned hard mask layers (not shown) formed on stacked layer 108* of FIG. 4A. In some embodiments, hard mask layers can include layers of silicon oxide formed, for example, using a thermal oxidation process and/or layers of silicon nitride formed using, for example, low pressure chemical vapor deposition (LPCVD) or plasma enhanced CVD (PECVD). The etching of the structure of FIG. 4A can include a dry etch, a wet etch process, or a combination thereof.

The dry etch process can include using etchants having an oxygen-containing gas, a fluorine-containing gas (e.g., $CF_4$, $SF_6$, $CH_2F_2$, $CHF_3$, $NF_3$, and/or $C_2F_6$), a chlorine-containing gas (e.g., $Cl_2$, $CHCl_3$, $CCl_4$, HCl, and/or $BCl_3$), a bromine-containing gas (e.g., HBr and/or $CHBr_3$), ammonia gas ($NH_3$), an iodine-containing gas, other suitable etching gases and/or plasmas, or combinations thereof. The dry etch process can be carried out at high bias voltage ranging from about 150 V to about 350 V, at a radio frequency power ranging from about 10 W to about 50 W, at a pressure of about 5 Torr to about 50 Torr, at a temperature ranging from about 25° C. to about 40° C., and for a time period ranging from about 10 sec to about 40 sec.

The wet etch process can include etching in diluted hydrofluoric acid (DHF), potassium hydroxide (KOH) solution, ammonia ($NH_3$), a solution containing hydrofluoric acid (HF), nitric acid ($HNO_3$), acetic acid ($CH_3COOH$), or combinations thereof.

Figure 5B:
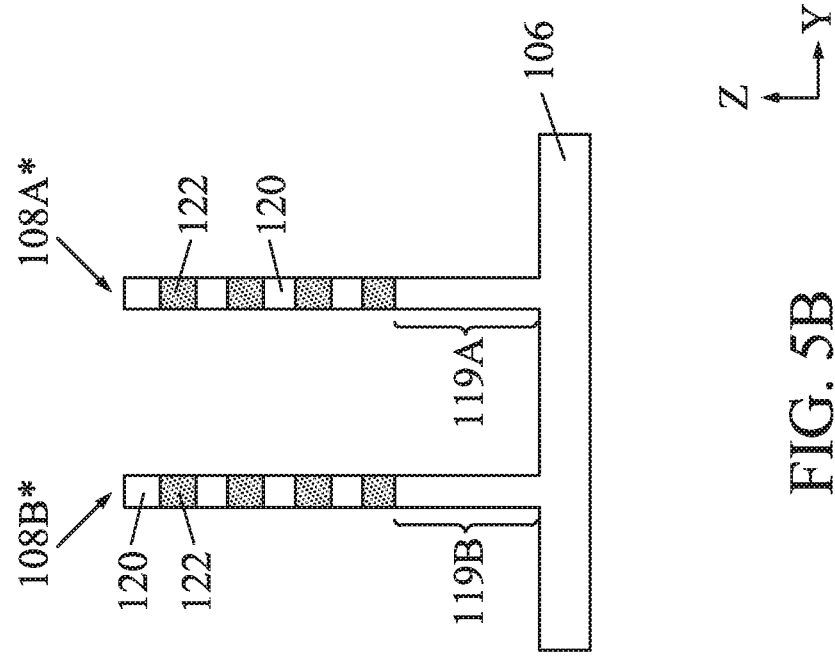
Figure 5A:
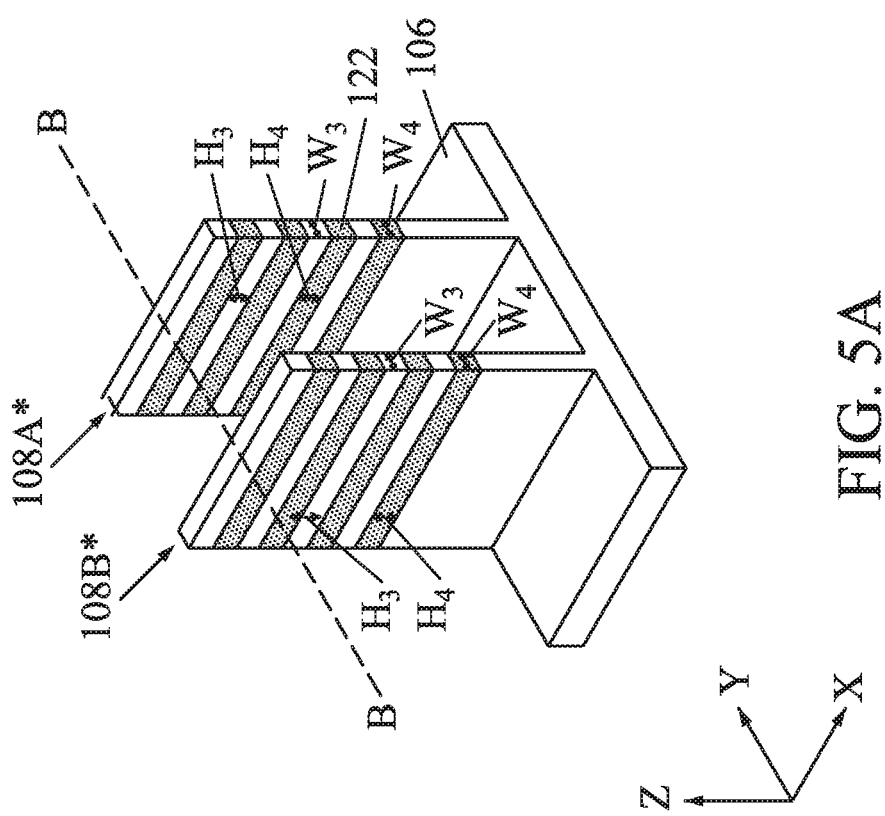

After the etching of stacked layer 108*, fin structures 108A*-108B* with fin base portions 119A-119B having respective vertical dimensions along a Z-axis ranging from about 40 nm to about 60 nm can be formed, as shown in FIGS. 5A-5B. Stacks of first and second semiconductor layers 120 and 122 formed on fin base portions 119A-119B can have respective vertical dimensions $H_3$ and $H_4$ along a Z-axis ranging from about 5 nm to about 30 nm and respective horizontal dimensions $W_3$ and $W_4$ along a Y-axis ranging from about 5 nm to about 50 nm. The ratios of $H_3/W_3$ and $H_4/W_4$ can each range from about 0.2 to about 5. In some embodiments, dimensions $H_3$-$H_4$ and $W_3$-$W_4$ can be equal to or different from each other, respectively. In some embodiments, the ratios of $H_3/W_3$ and $H_4/W_4$ can be equal to or different from each other, respectively.

Following the formation of fin structures 108A*-108B*, passivation layers 109A-109B can be formed on fin structures 108A*-108B*, respectively, and STI regions 138 can be formed on passivation layers 109A-109B, as shown in FIGS. 6A-6B. The process for forming passivation layers 109A-109B on fin structures 108A*-108B* can include blanket depositing a passivation layer 109 on the structure of FIG. 5A using one or more precursor gases having fluorine, chlorine, nitrogen, oxygen, hydrogen, deuterium, $NH_3$, and/or hydrogen sulfide ($H_2S$) in an ALD or CVD process. The portions of blanket deposited passivation layer 109 on fin structures 108A*-108B* can be referred to as "passivation layers 109A-109B," respectively.

The formation of STI regions 138 can include (i) depositing a layer of nitride material (not shown) on passivation layer 109 using ALD or CVD, (ii) depositing a layer of oxide material (not shown) on the layer of nitride material using ALD or CVD, (iii) depositing a layer of insulating material (not shown) on the layer of oxide material, (iv) annealing the layer of insulating material, (v) chemical mechanical polishing (CMP) the layers of nitride and oxide materials and the annealed layer of insulating material, and (vi) etching back the polished structure by a dry etch process, a wet etch process, or a combination thereof to form STI regions 138 of FIGS. 6A-6B.

Referring to FIG. 3, in operation 310, polysilicon structures are formed on the fin structures. For example, as shown in FIGS. 6A-6B, polysilicon structures 112A*-112B* can be formed on fin structures 108A*-108B* and outer spacers 114A-114B can be formed on sidewalls polysilicon structures 112A*-112B*. In some embodiments, prior to the formation of polysilicon structures 112A*-112B*, protective oxide layers 640A-640B can be formed on respective passivation layers 109A-109B and polysilicon structures 112A*-112B* can be formed on respective protective oxide layer 640A-640B and STI regions 138, as described with reference to FIGS. 6A-6B.

The process for forming protective oxide layers 640A-640B can include (i) blanket depositing a layer of oxide material (not shown) on the partial semiconductor device 100 (not shown) formed after the formation of STI regions 138, (ii) a high temperature annealing process, and (iii) an etching process. The layer of oxide material can include silicon oxide and can be blanket deposited using a suitable deposition process, such as CVD, ALD, plasma enhanced ALD (PEALD), physical vapor deposition (PVD), or e-beam evaporation. In some embodiments, the layer of oxide material can be blanket deposited using PEALD at an energy ranging from about 400 W to about 500 W and at a temperature ranging from about 300° C. to about 500° C. The blanket deposition of the layer of oxide material can be followed by a dry annealing process under oxygen gas flow at a temperature ranging from about 800° C. to about 1050° C. The oxygen precursor concentration can be in a range of about 0.5% to about 5% of the total gas flow rate. In some embodiments, the annealing process can be a flash process where the annealing time can be between about 0.5 s to about 5 s. The etching process to form protective oxide layers 640A-640B may not follow the annealing process and can be carried out during the formation of polysilicon structures 112A*-112B* described below or as a separate etching process after the formation of polysilicon structures 112A*-112B*.

The annealing of the blanket deposited layer of oxide material for protective oxide layers 640A-640B can be followed by the formation of polysilicon structures 112A*-112B*. During subsequent processing, polysilicon structures 112A*-112B* can be replaced in a gate replacement process to form gate structures 112A-112B, respectively. In some embodiments, the process for forming polysilicon structures 112A*-112B* can include blanket depositing a layer of polysilicon material on the annealed layer of oxide material for protective oxide layers 640A-640B and etching the blanket deposited layer of polysilicon material through patterned hard mask layers 642A-642B formed on the layer of polysilicon material. In some embodiments, the polysilicon material can be undoped and hard mask layers 642A-642B can include an oxide layer and/or a nitride layer. The oxide layer can be formed using a thermal oxidation process and the nitride layer can be formed by LPCVD or PECVD. Hard mask layers 642A-642B can protect polysilicon structures 112A*-112B* from subsequent processing steps (e.g., during formation of inner spacers 113A-113B, outer spacers 114A-114B, epitaxial fin regions 110A-110B, ILD layer 118, and/or ESL 116).

The blanket deposition of the layer of polysilicon material can include CVD, PVD, ALD, or other suitable deposition processes. In some embodiments, the etching of the blanket deposited layer of polysilicon material can include a dry etching process, a wet etching process, or a combination thereof. In some embodiments, the etching of the blanket deposited layer of polysilicon material can include four etching steps. The first polysilicon etch step can include using a gas mixture having hydrogen bromide (HBr), oxygen ($O_2$), fluoroform ($CHF_3$), and chlorine ($Cl_2$). The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and argon (Ar) at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. Along with the polysilicon material, the fourth polysilicon etch step can remove portions of the annealed blanket deposited layer of oxide material for protective oxide layers 640A-640B that are not covered by polysilicon structures 112A*-112B*, according to some embodiments. The first polysilicon etch step can have a higher polysilicon etch rate than the second, third, and/or fourth polysilicon etch steps. The first polysilicon etch step can be used to etch unwanted portions of the blanket deposited layer of polysilicon material above fin structures 108A*-108B*. The second, third, and fourth polysilicon etch steps can be used to etch unwanted portions of the blanket deposited layer of polysilicon material within high aspect ratio spaces 643.

In some embodiments, vertical dimensions of polysilicon structures 112A*-112B* along a Z-axis on top surfaces of fin structures 108A*-108B* can be in a range from about 40 nm to about 60 nm. Polysilicon structures 112A*-112B* can have an aspect ratio equal to or greater than about 9, where aspect ratio is a ratio of a vertical dimension along a Z-axis to a horizontal dimension along a Y-axis of polysilicon structures 112A*-112B*. In some embodiments, horizontal dimensions between center lines of adjacent polysilicon structures 112A*-112B* along a Y-axis (e.g., spacing) can be in a range from about 30 nm to about 70 nm.

Following the formation of polysilicon structures 112A*-112B*, the portions of the blanket deposited layer of oxide that are not covered by polysilicon structures 112A*-112B* can be removed by a dry or a wet etch process if they are not removed during the fourth polysilicon etch step to form the structure of FIGS. 6A-6B. The structure of FIGS. 6A-6B has polysilicon structures 112A*-112B* and protective oxide layers 640A-640B disposed on stacks of nanostructured regions 120B and 122B (FIG. 6B), respectively, and has stacks of nanostructured regions 120A and 122A (FIG. 6A) extending out from either sides of polysilicon structures 112A*-112B*, respectively, along an X-axis.

In some embodiments, protective oxide layers 640A-640B can have vertical dimensions (e.g., thickness on top surface of fin structures 108A*-108B*) along a Z-axis and horizontal dimensions (e.g., thickness on sidewalls of fin structures 108A*-108B*) along a Y-axis ranging from about 1 nm to about 3 nm. In some embodiments, the vertical dimensions can be equal to or greater than the horizontal dimensions. The presence of protective oxide layers 640A-640B allow etching polysilicon material from high aspect ratio spaces 643 (e.g., aspect ratio greater than 1:15, 1:18, or 1:20) without substantially etching and/or damaging fin structures 108A*-108B* during the formation of polysilicon structures 112A*-112B*.

Following the formation of polysilicon structures 112A*-112B*, outer spacers 114A-114B can be formed on sidewalls of polysilicon structures 112A*-112B* and on portions of passivation layers 109A-109B not covered by polysilicon structures 112A*-112B*, as shown in FIGS. 6A-6B.

Referring to FIG. 3, in operation 315, n- and p-type epitaxial fin regions are selectively formed on the fin structures. For example, n- and p-type epitaxial fin regions 110A-110B can be selectively formed on portions of fin structures 108A*-108B* (e.g., nanostructured regions 120A and 122A, respectively) that are not underlying polysilicon structures 112A*-112B*, respectively, as described with reference to FIGS. 7A-8D. In some embodiments, prior to the selective formation of epitaxial fin regions 110A-110B, inner spacers 113A-113B can be selectively formed on portions of nanostructured regions 120A and 122B that are not wrapped around by epitaxial fin regions 110A-110B, respectively, in subsequent processing. In some embodiments, the selective formation of inner spacers 113A can be followed by the selective formation of epitaxial fin regions 110A, which can be followed by the selective formation of inner spacers 113B and subsequently, the selective formation of epitaxial fin regions 110B, as described with reference to FIGS. 7A-8D.

Figures 7C, 7D:
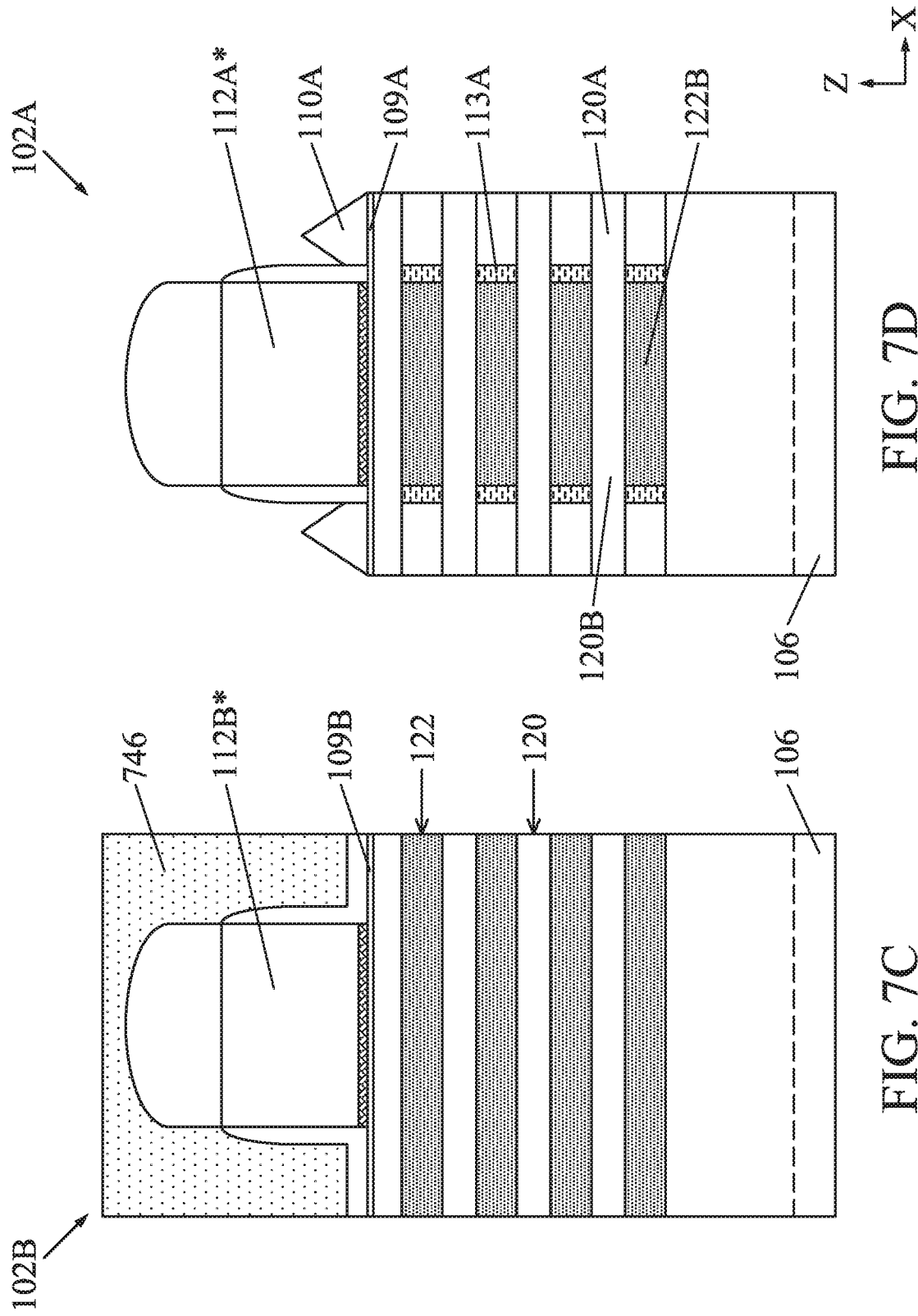

Prior to the formation of inner spacers 113A and epitaxial regions 110A of FET 102A, FET 102B can be protected by patterning a photoresist layer 746 on FET 102B as shown in FIGS. 7B-7C. Photoresist layer 746 is not shown in FIG. 7A for the sake of clarity. The process for forming inner spacers 113A can include sequential steps of (i) etching portions of outer spacers 114A from the stack of nanostructured regions 120A and 122A extending out from either sides of polysilicon structure 112A* along an X-axis, (ii) etching nanostructured regions 122A from the stack of nanostructured regions 120A and 122A to form suspended nanostructured regions 120A with openings (not shown) between them, (iii) blanket depositing a layer of low-k dielectric material (not shown) until the openings are filled or partially filled with the layer of low-k dielectric material, and (iv) etching the blanket deposited layer of low-k dielectric material to etch back the layer of low-k dielectric material within the openings to form inner spacers 113A as shown in FIG. 7D.

The etching of outer spacers 114A can include a dry etch process with etchant gases, such as $CH_4$, O2, and $CH_3F$. The flow rate ratio of $CH_4:O_2:CH_3F$ can range from about 1:1:1 to about 1:2:4. The etching of nanostructured regions 122A can include using a dry etching process or a wet etching process with higher selectivity towards SiGe than Si. For example, the wet etching process can include using a mixture of sulfuric acid ($H_2SO_4$) and hydrogen peroxide ($H_2O_2$) (SPM) and/or a mixture of ammonia hydroxide ($NH_4OH$) with $H_2O_2$ and deionized (DI) water (APM). As a result of the etching of nanostructured regions 122A, suspended nanostructured regions 120A can be formed with openings between them. The etching process can be controlled such that the openings extend along an X-axis at least under outer spacers 114A and the sidewalls of nanostructured regions 122B are substantially aligned with interfaces between outer spacers 114A and polysilicon structure 112A*. In some embodiments, the openings can further extend along an X-axis under polysilicon structure 112A* to prevent the formation of gate structure 112A under outer spacers 114A during the replacement of nanostructured regions 122B and polysilicon structure 112A* with gate structure 112A in subsequent processing.

The blanket deposition of the layer of low-k dielectric material can include using an ALD process or a CVD process. In some embodiments, the blanket deposition process can include a plurality of cycles of deposition and etch processes. In some embodiments, the low-k dielectric material can include silicon oxycarbonitride (SiOCN), silicon carbon nitride (SiCN), silicon oxide carbide (SiOC), polymides, carbon-doped oxides, fluorine-doped oxides, hydrogen-doped oxides, or a combination thereof. The etching of the blanket deposited layer of low-k dielectric material can include a dry etch process using a gas mixture of HF and $NF_3$. The gas ratio of HF to $NF_3$ can range from about 1 to about 20.

Epitaxial fin regions 110A can be grown around the suspended nanostructured regions 120A after the formation of inner spacers 113A. In some embodiments, epitaxial fin regions 110A can be grown by (i) CVD, such as low pressure CVD (LPCVD), atomic layer CVD (ALCVD), ultrahigh vacuum CVD (UHVCVD), remote plasma CVD (RPCVD), or any suitable CVD; (ii) molecular beam epitaxy (MBE) processes; (iii) any suitable epitaxial process; or (iv) a combination thereof. In some embodiments, epitaxial fin regions 110A can be grown by an epitaxial deposition/partial etch process, which repeats the epitaxial deposition/partial etch process at least once. N-type epitaxial fin regions 110A can include Si without any substantial amount of Ge (e.g., with no Ge) and can be in-situ doped during the epitaxial growth process using n-type dopants, such as phosphorus or arsenic. For n-type in-situ doping, n-type doping precursors such as, but not limited to, phosphine (PH3), arsine (AsH3), and/or other n-type doping precursor, can be used.

After the formation of inner spacers 113A and epitaxial regions 110A of FET 102A, photoresist layer 746 can be removed from FET 102B and another photoresist layer 846 can be patterned on FET 102A (shown in FIGS. 8B and 8D) to protect FET 102A during the subsequent processing steps to form inner spacers 113B and epitaxial regions 110B of FET 102B as described with reference to FIGS. 8A-8D. Photoresist layer 846 is not shown in FIG. 8A for the sake of clarity.

Figure 8B:
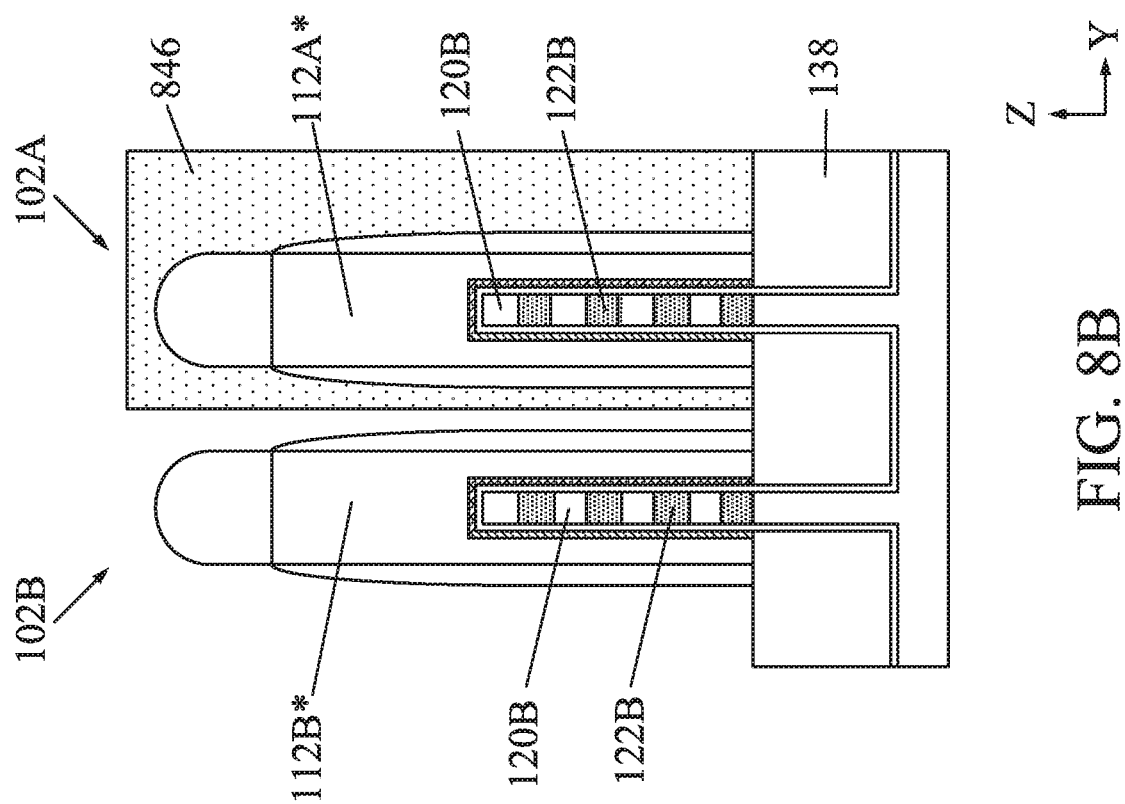
Figure 8A:
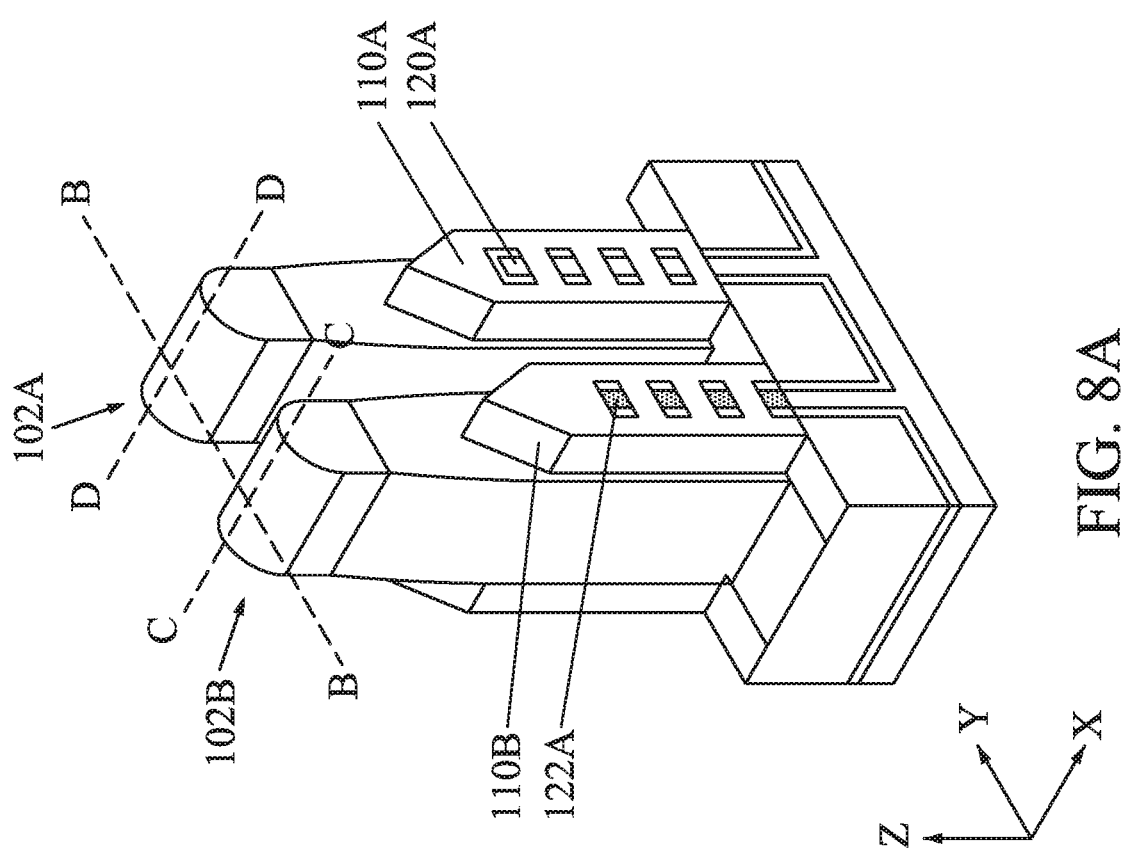
Figure 8D:
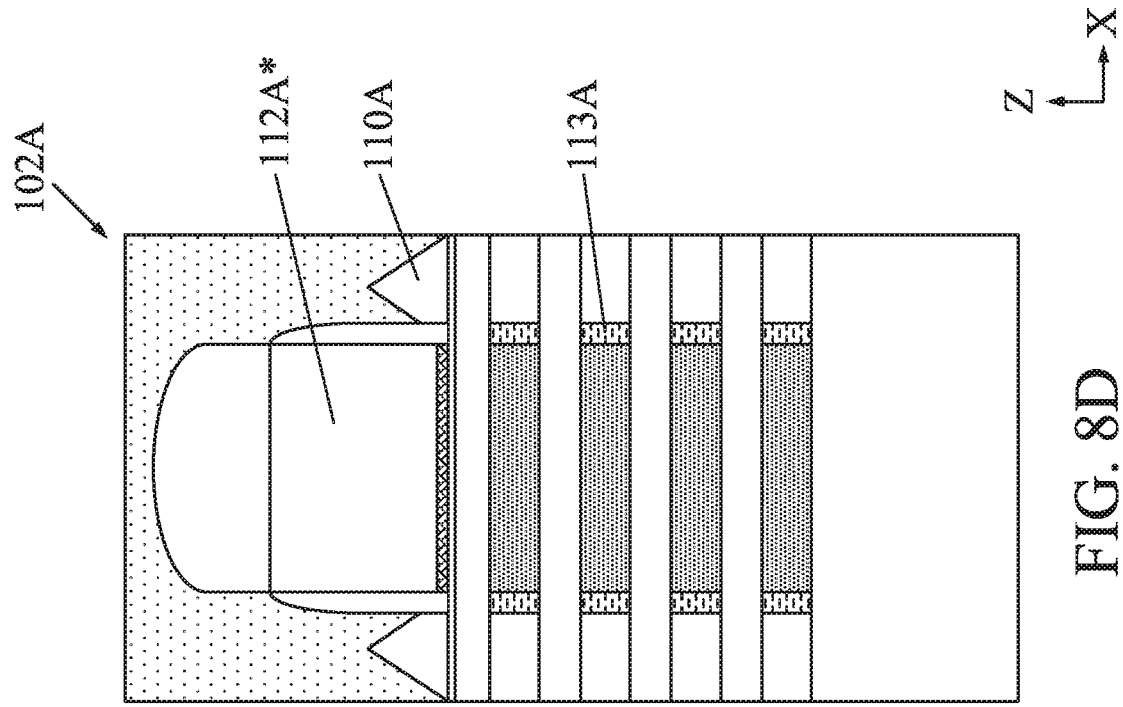
Figure 8C:
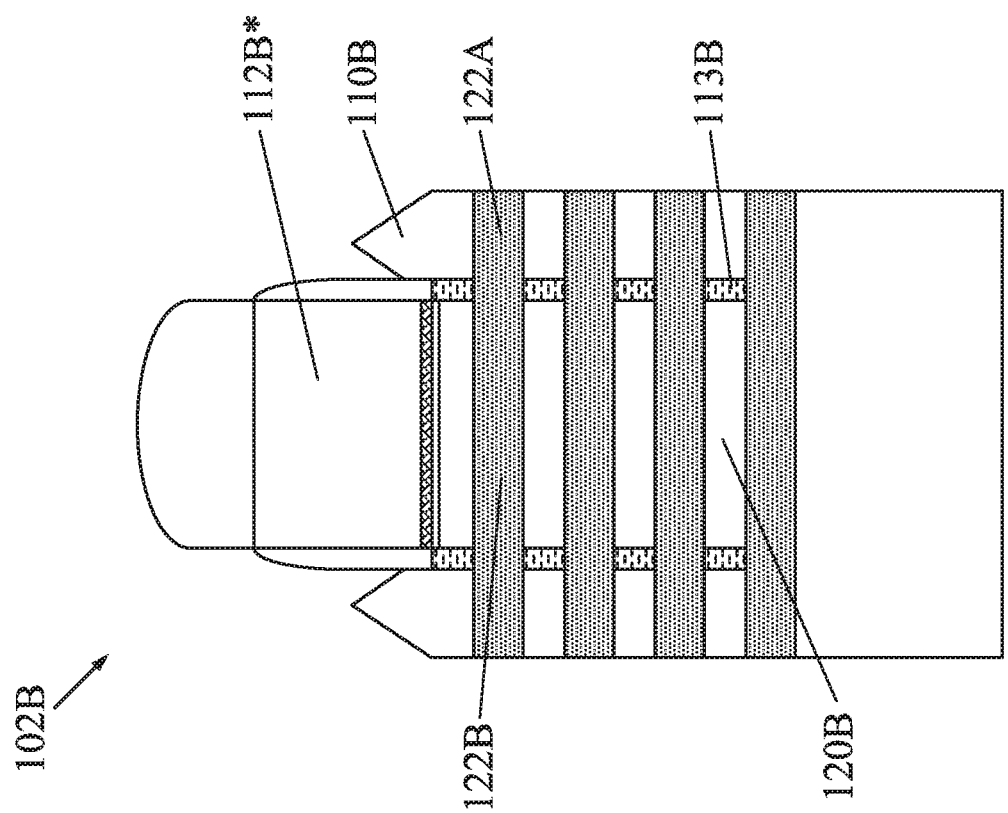

The process for forming inner spacers 113B can include sequential steps of (i) etching portions of outer spacers 114B from the stack of nanostructured regions 120A and 122A extending out from either sides of polysilicon structure 112B* along an X-axis, (ii) etching nanostructured regions 120A from the stack of nanostructured regions 120A and 122A to form suspended nanostructured regions 122A with openings (not shown) between them, (iii) blanket depositing a layer of low-k dielectric material (not shown) until the openings are filled or partially filled with the layer of low-k dielectric material, and (iv) etching the blanket deposited layer of low-k dielectric material to etch back the layer of low-k dielectric material within the openings to form inner spacers 113B as shown in FIG. 8C.

The process for etching the portions of outer spacers 114B can be similar to the etching process of outer spacers 114A. The etching of nanostructured regions 120A can include using a wet etching process with higher selectivity towards Si than SiGe. For example, the wet etching process can include using a mixture (NH4OH) with HCl. The process for etching nanostructured regions 120A can be controlled such that the openings extend along an X-axis at least under outer spacers 114B and the sidewalls of nanostructured regions 120B are substantially aligned with interface between outer spacers 114B and polysilicon structure 112B*. In some embodiments, the openings can further extend along an X-axis under polysilicon structure 112B* to prevent the formation of gate structure 112B under outer spacers 114B during the replacement of nanostructured regions 120B and polysilicon structure 112B* with gate structure 112B in subsequent processing. The blanket deposition and the etching of the layer of low-k dielectric material can be similar to that used to deposit and etch back the layer of low-k dielectric material for forming inner spacers 113A.

Epitaxial fin regions 110B can be grown around the suspended nanostructured regions 122A after the formation of inner spacers 113B. Epitaxial fin regions 110B can be grown similarly as epitaxial fin regions 110A described with reference to FIG. 7A-7D, except p-type epitaxial fin regions 110B with SiGe can be in-situ doped during the epitaxial growth process using p-type dopants, such as boron, indium, or gallium. For p-type in-situ doping, p-type doping precursors such as, but not limited to, diborane (B2H6), boron trifluoride (BF3), and/or other p-type doping precursors can be used. After the formation of inner spacers 113B and epitaxial regions 110B, photoresist layer 846 can be removed from FET 102A.

In some embodiments, the processing steps for forming inner spacers 113A-113B can be simultaneously performed without using photoresist layers 746 and 846 if both FETs 102A-102B are of the same conductivity type (e.g., n-type or p-type). Similarly, the processing steps for forming epitaxial fin regions 110A-11B can be simultaneously performed without using photoresist layers 746 and 846 after simultaneously forming inner spacers 113A-113B if both FETs 102A-102B are of similar conductivity type.

Referring to FIG. 3, in operation 320, nanostructured channel regions are formed between the n-type epitaxial fin regions and between the p-type epitaxial fin regions. For example, nanostructured channel regions 120B and 122B can be formed sequentially in regions of fin structures 108A*-108B* underlying polysilicon structures 112A*-112B*, as described with reference to FIGS. 9A-12D. Prior to the formation of nanostructured channel regions 120B and 122B, ESL 116 can be deposited on the structure of FIG. 8A and ILD 118 can be deposited on ESL 116.

In some embodiments, ESL 116 can be formed of materials including $SiN_x$, $SiO_x$, SiON, SiC, SiCN, BN, SiBN, SiCBN, or a combination thereof. The formation of ESL 116 can include blanket depositing a layer of material for ESL 116 on the structure of FIG. 8A using PECVD, sub atmospheric chemical vapor deposition (SACVD), LPCVD, ALD, high-density plasma (HDP), plasma enhanced atomic layer deposition (PEALD), molecular layer deposition (MLD), plasma impulse chemical vapor deposition (PICVD), or other suitable deposition methods.

Figure 9D:
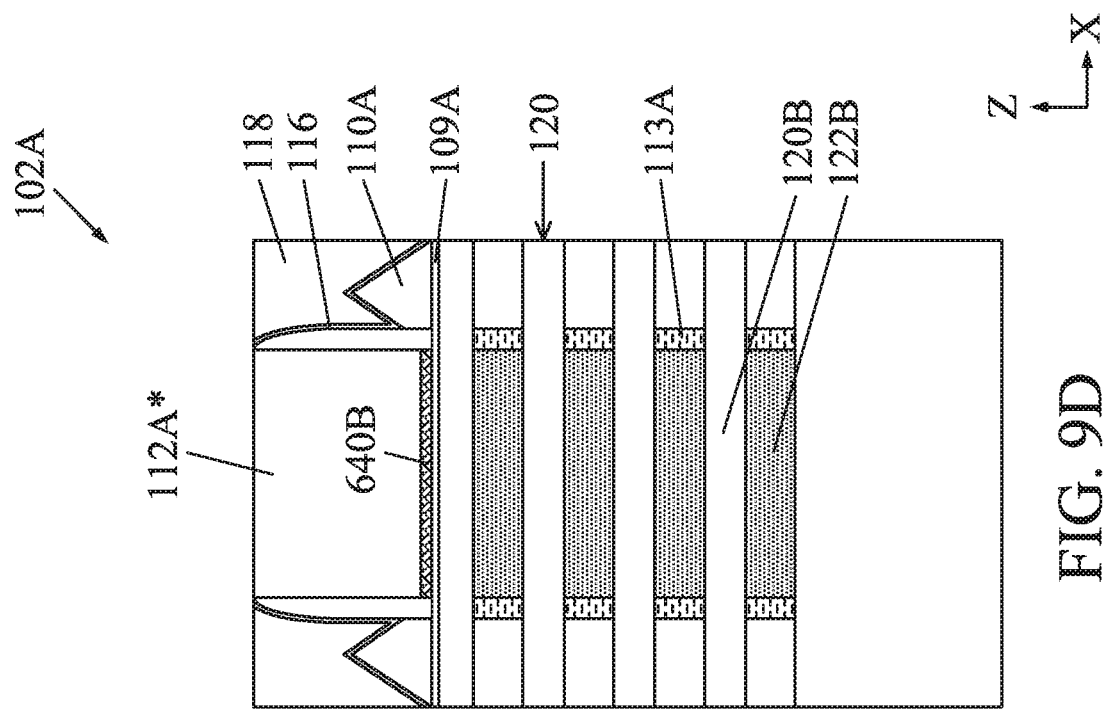

The blanket deposition of the layer of material for ESL 116 can be followed by a blanket deposition of a layer of dielectric material for ILD 118. In some embodiments, the dielectric material can be silicon oxide. The layer of dielectric material can be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using a FCVD process. The blanket deposition process can be followed by a thermal annealing of the deposited layer of dielectric material in steam at a temperature ranging from about 200° C. to about 700° C. for a period ranging from about 30 minutes to about 120 minutes. The thermal annealing can be followed by a CMP process to coplanarize top surfaces of ESL 116, ILD 118, outer spacers 114A-114B, and polysilicon structures 112A*-112B* with each other as shown in FIG. 9A. During the CMP process, hard mask layers 642A-642B can be removed.

Figure 9C:
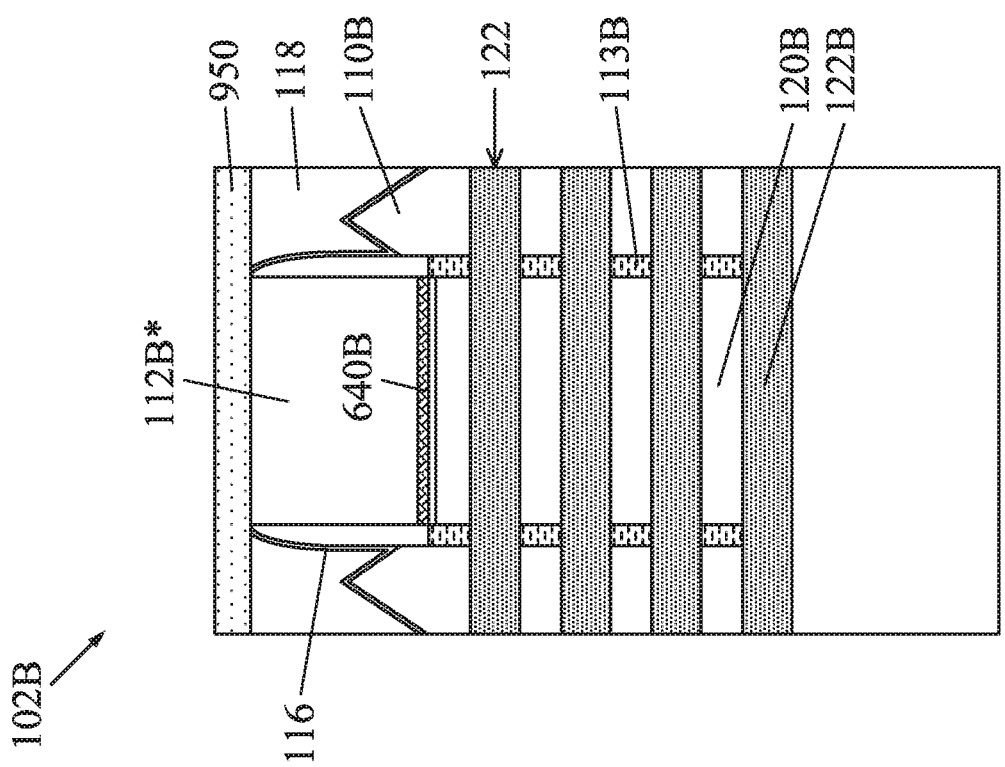
Figure 10B:
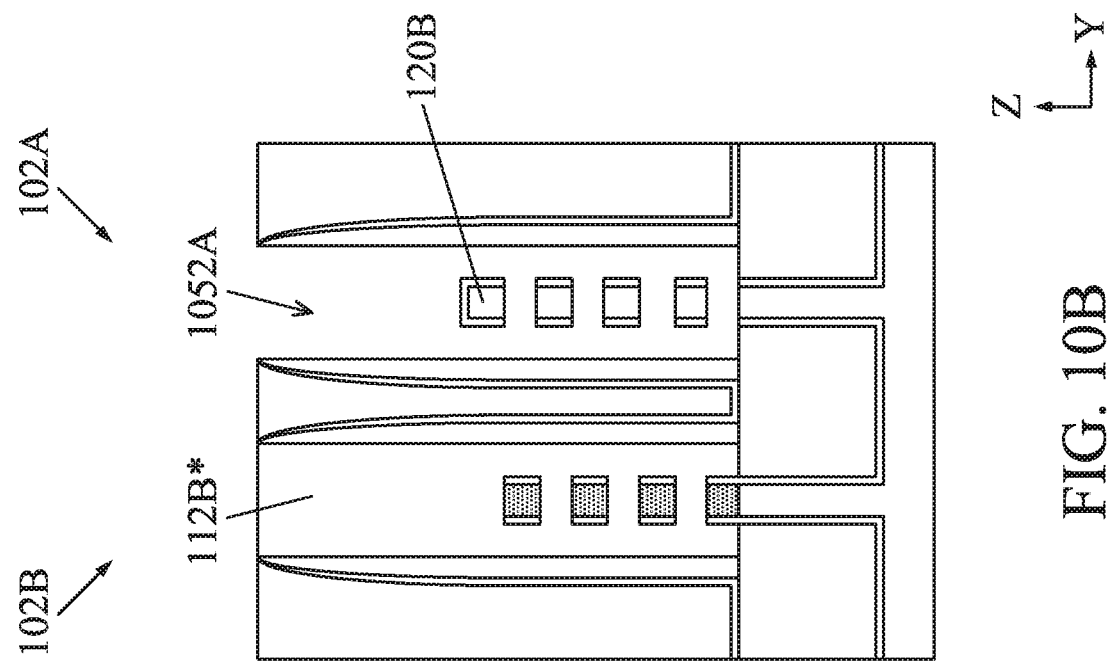
Figure 10A:
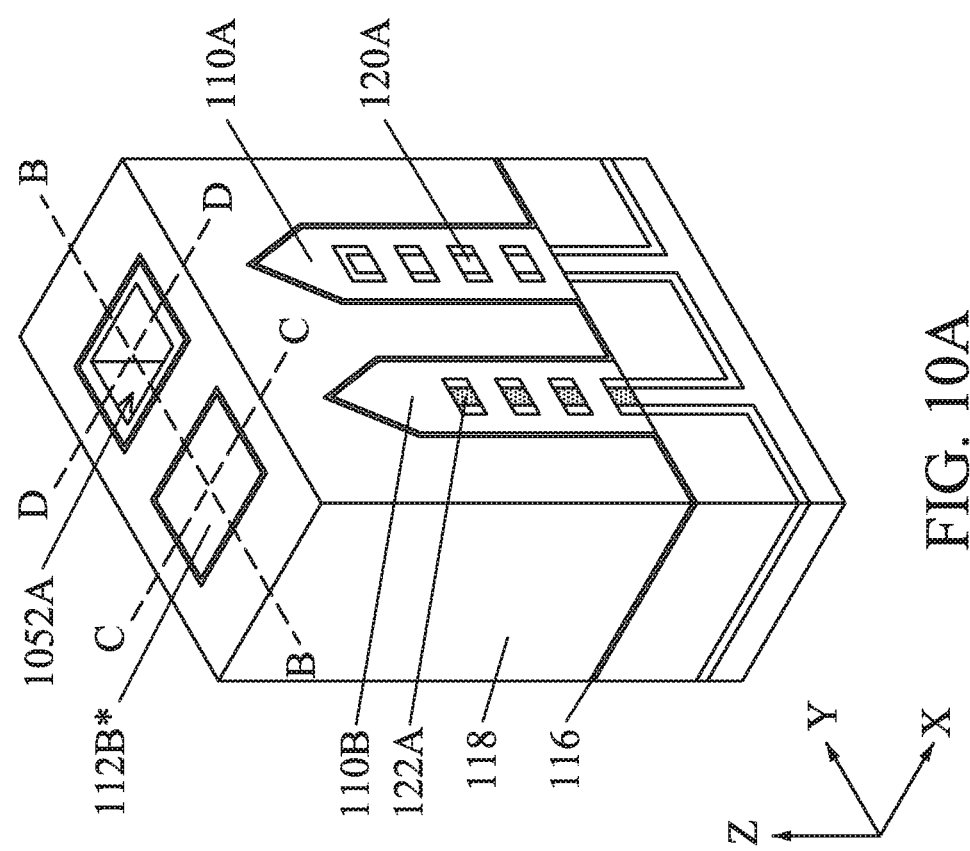
Figure 10D:
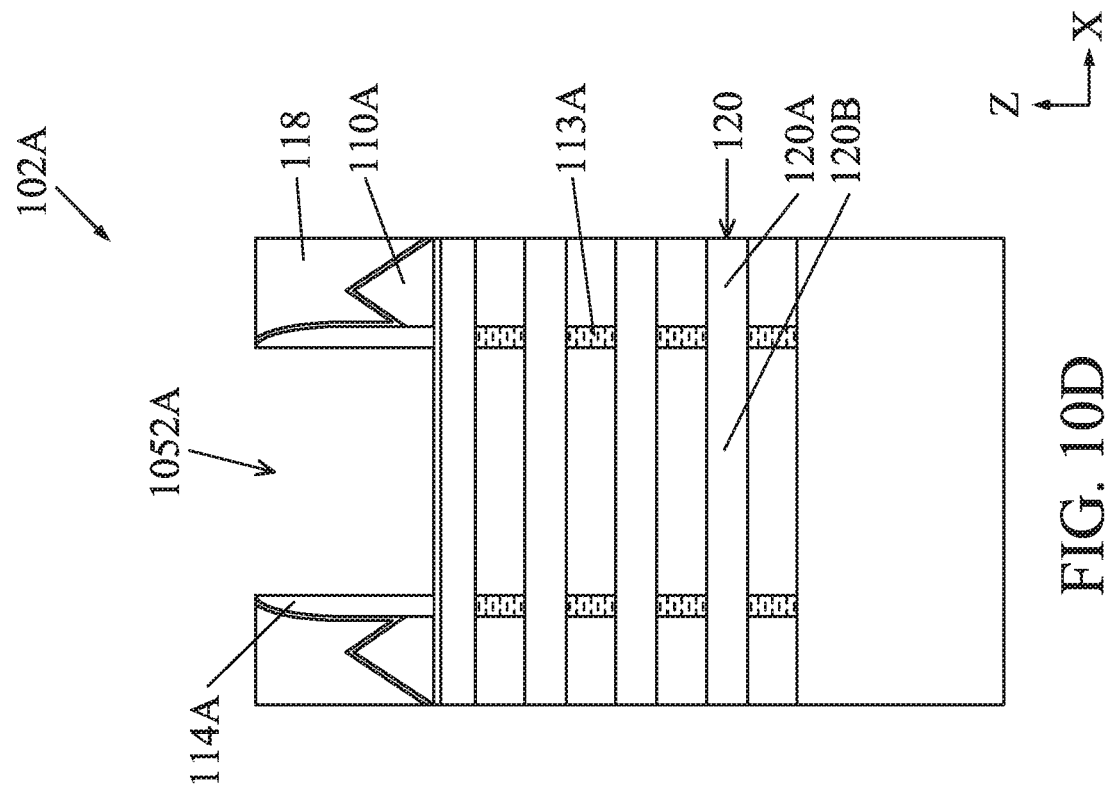
Figure 10C:
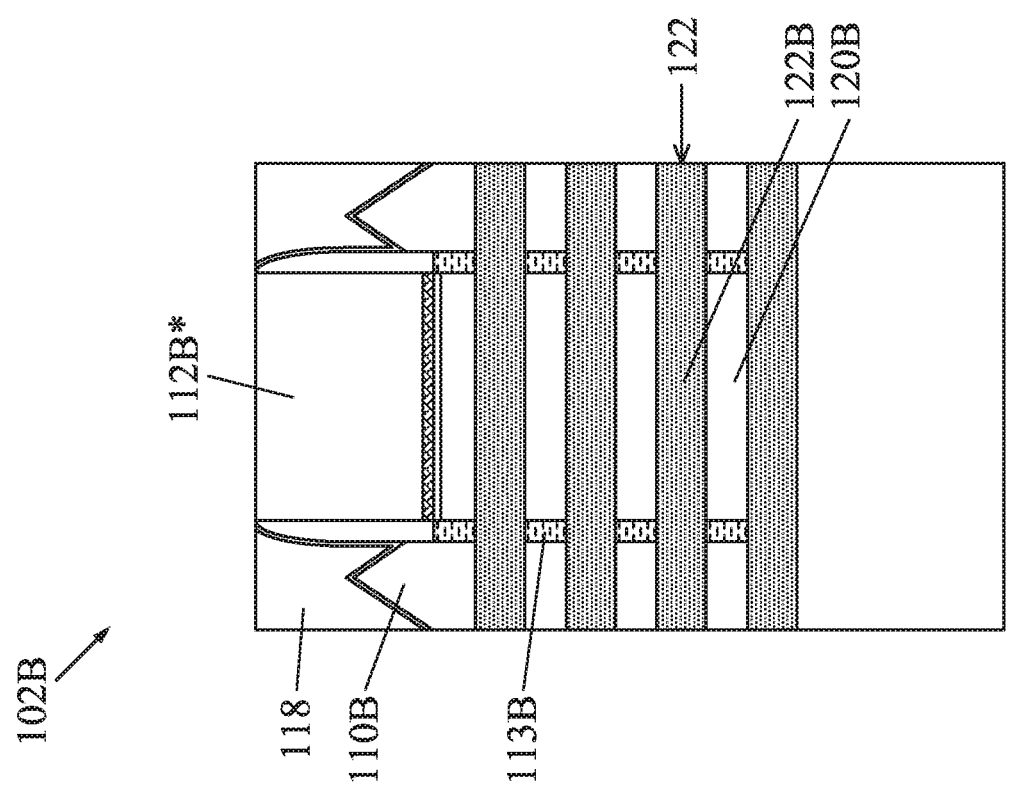

Following the CMP process, nanostructured channel regions 120B of FET 102A can be formed as described with reference to FIGS. 9A-10D. The process for forming nanostructured channel regions 120B can include sequential steps of (i) forming a photoresist layer 950 on FET 102B as shown in FIGS. 9A-9C, (ii) etching polysilicon structure 112A* and protective oxide layer 640A from the structure of FIG. 9A, and (iii) etching nanostructured regions 122B of FET 102A from the structure of FIG. 9A. In some embodiments, polysilicon structure 112A* and protective oxide layer 640A can be etched using the first, second, third, and/or fourth polysilicon etch steps described in operation 310. In some embodiments, nanostructured regions 122B can be etched using a wet etch process similar to that used for etching nanostructured regions 122A described with reference to FIGS. 7A-7D. As a result of the etching of nanostructured regions 122B, nanostructured channel regions 120B are formed with gate openings 1052A around them as shown in FIGS. 10B and 10D.

Figure 11B:
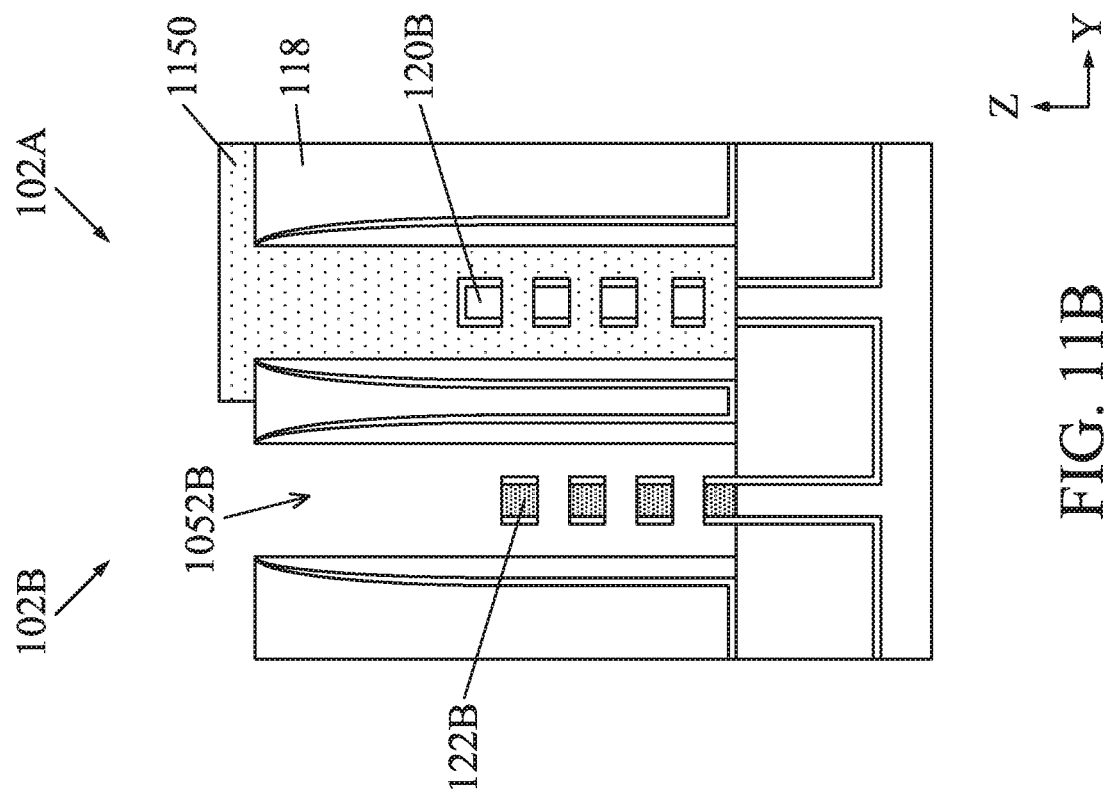
Figure 11A:
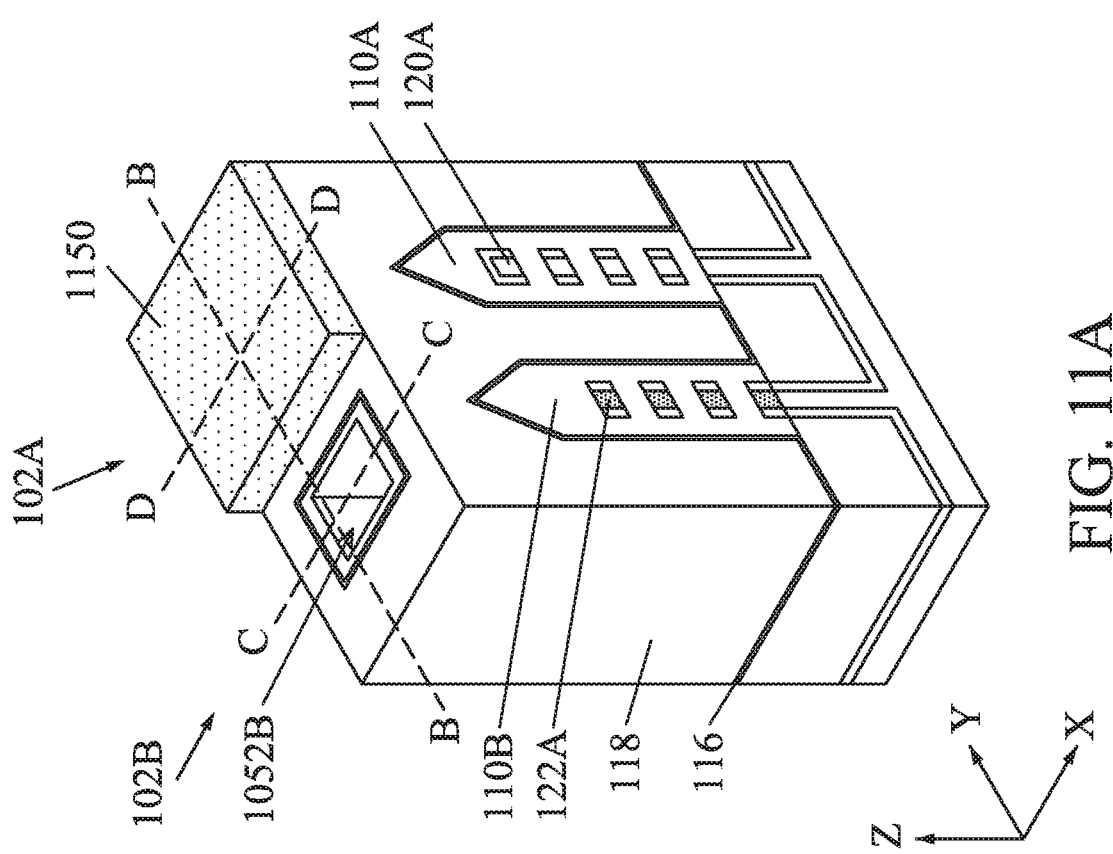
Figure 12D:
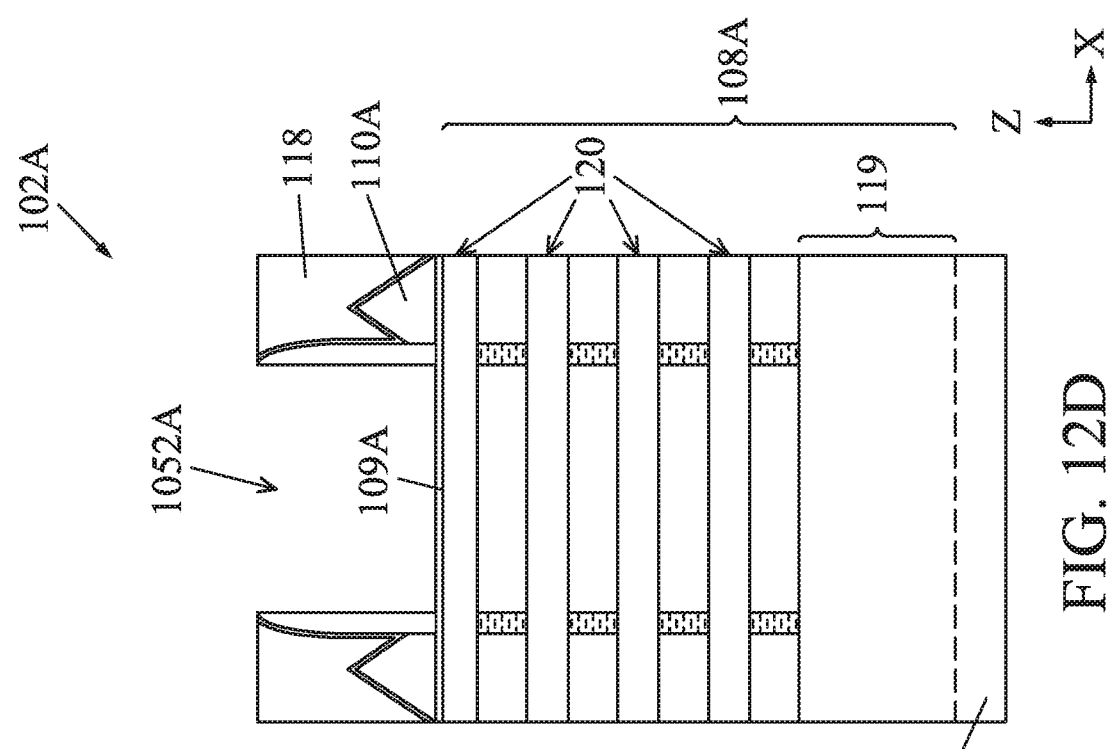
Figure 12C:
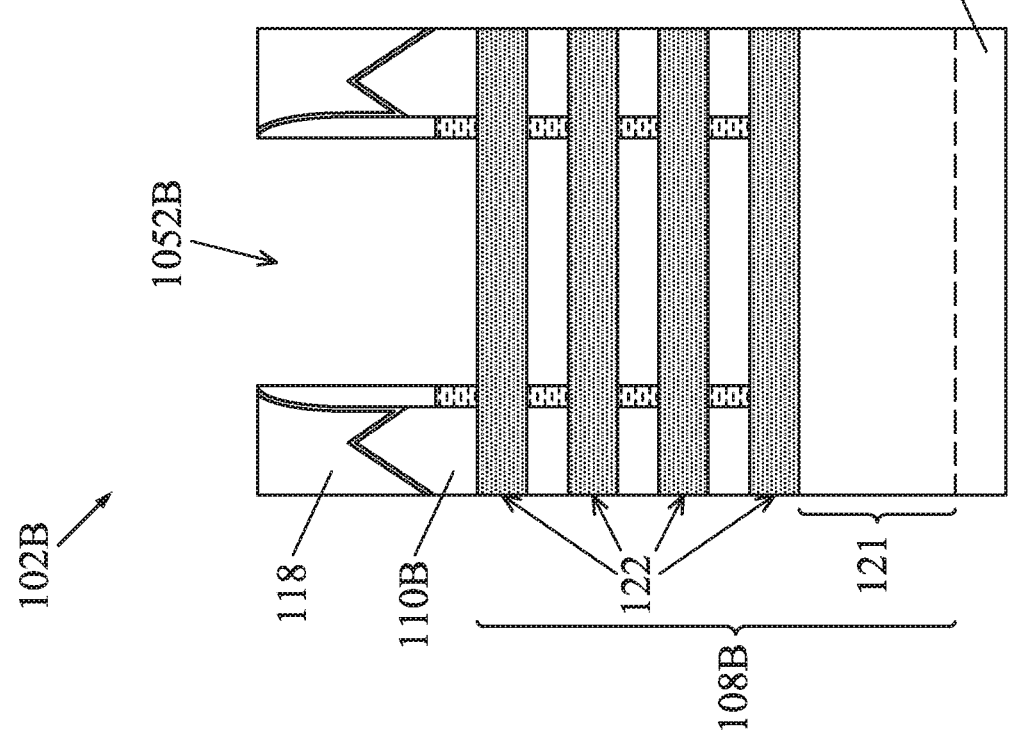

Following the etching of nanostructured regions 122B of FET 102A, nanostructured channel regions 122B of FET 102B can be formed as described with reference to FIGS. 11A-12D. The process for forming nanostructured channel regions 122B can include sequential steps of (i) removing photoresist layer 950, (ii) forming a photoresist layer 1150 within gate openings 1052A (shown in FIGS. 10B and 10D) to protect nanostructured channel regions 120A as shown in FIGS. 11B and 11D, (iii) etching polysilicon structure 112B* and protective oxide layer 640B, and (iv) etching nanostructured regions 120B of FET 102B from the structure of FIG. 10A. Similar to the etching of polysilicon structure 112A* and protective oxide layer 640A, polysilicon structure 112B* and protective oxide layer 640B can be etched using the first, second, third, and/or fourth polysilicon etch steps described in operation 310. In some embodiments, nanostructured regions 120B can be etched using a wet etch process similar to that used for etching nanostructured regions 120A described with reference to FIGS. 8A-8D. As a result of the etching of nanostructured regions 120B, nanostructured channel regions 122B are formed with gate openings 1052B around them as shown in FIGS. 11B and 11D. Following the formation of nanostructured channel regions 122B of FET 102B, photoresist layer 1150 can be removed from gate openings 1052A to form the structure of FIGS. 12A-12D.

The vertical dimensions (e.g., spacing) of gate openings 1052A-1052B along a Z-axis can be adjusted based on the thickness of nanostructured regions 122B and 120B removed from FETs 102A-102B and/or by additional etching of nanostructured channel regions 120B and 122B after the formation of gate openings 1052A-1052B, respectively. The vertical dimensions can be a value (e.g., from about 8 nm to about 12 nm) such that nanostructured channel regions 120B and 122B can be wrapped around by at least interfacial oxide layers 127A-127B and gate dielectric layers 128A-128B to fill gate openings 1052A-1052B to prevent shorting between gate structures 112A-112B and S/D regions 126A-126B during operation of FETs 102A-102B, respectively. In some embodiments, the vertical dimensions can be a value (e.g., from about 8 nm to about 12 nm) such that nanostructured channel regions 120B and 122B can be wrapped around by at least interfacial oxide layers 127A-127B, gate dielectric layers 128A-128B, gate WFM layers 130A-130B to fill gate openings 1052A-1052B to achieve ultra-low threshold voltage for FETs 102A-102B, respectively.

Referring to FIG. 3, in operations 325-345, gate-all-around (GAA) structures are formed on the nanostructured channel regions. For example, using the steps described in operations 325-345, gate structures 112A-112B can be formed wrapped around nanostructured channel regions 120B and 122B, respectively, as described with reference to FIGS. 13A-17B and 1A-1D.

In operation 325, interfacial oxide layers and a gate dielectric layer are deposited and annealed on the nanostructured channel regions. For example, interfacial oxide layers 127A-127B and a gate dielectric layer 128 can be deposited and annealed on nanostructured channel regions 120B and 122B, respectively, as described with reference to FIGS. 13A-14B. During subsequent processing, gate dielectric layer 128 can form gate dielectric layers 128A-128B as shown in FIGS. 1A-1D.

Interfacial oxide layers 127A-127B can be formed on exposed surfaces of nanostructured channel regions 120B and 122B within gate openings 1052A-1052B, respectively. In some embodiments, interfacial oxide layers 127A-127B can be formed by exposing nanostructured channel regions 120B and 122B to an oxidizing ambient. For example, the oxidizing ambient can include a combination of ozone ($O_3$), a mixture of ammonia hydroxide, hydrogen peroxide, and water (SC1 solution), and/or a mixture of hydrochloric acid, hydrogen peroxide, water (SC2 solution). As a result of the oxidation process, oxide layers ranging from about 0.5 nm to about 1.5 nm can be formed on the exposed surfaces of nanostructured channel regions 120B and 122B.

Figure 13B:
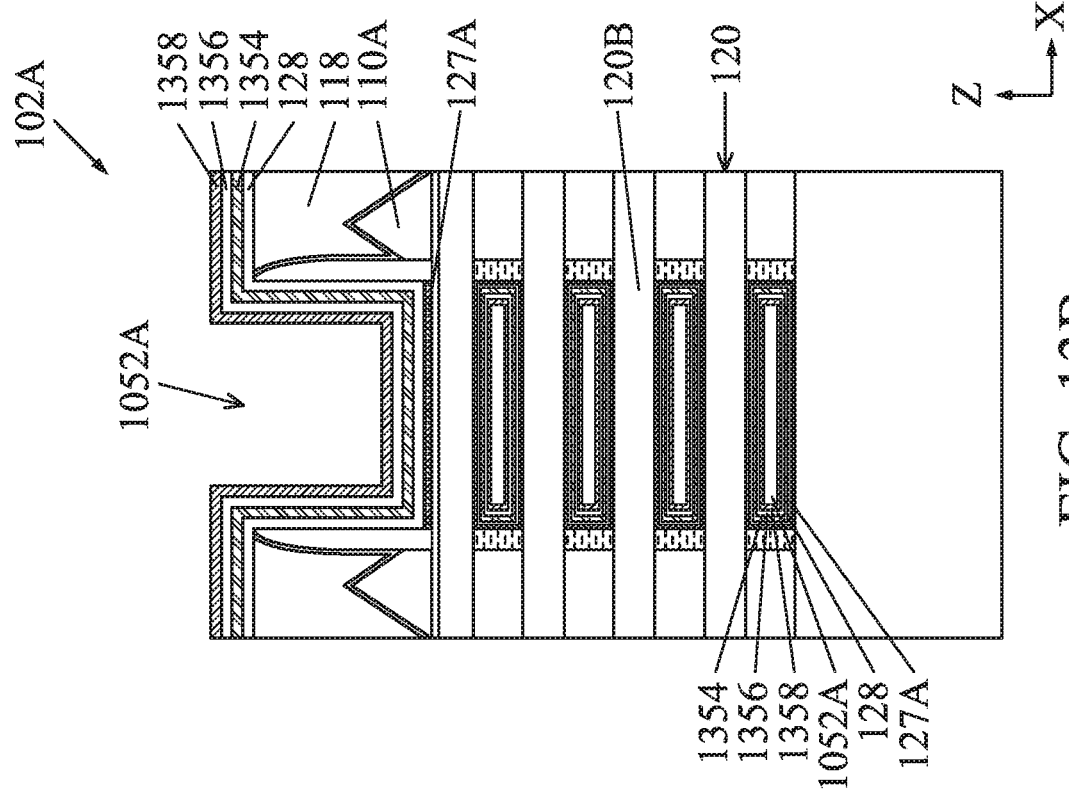
Figure 13A:
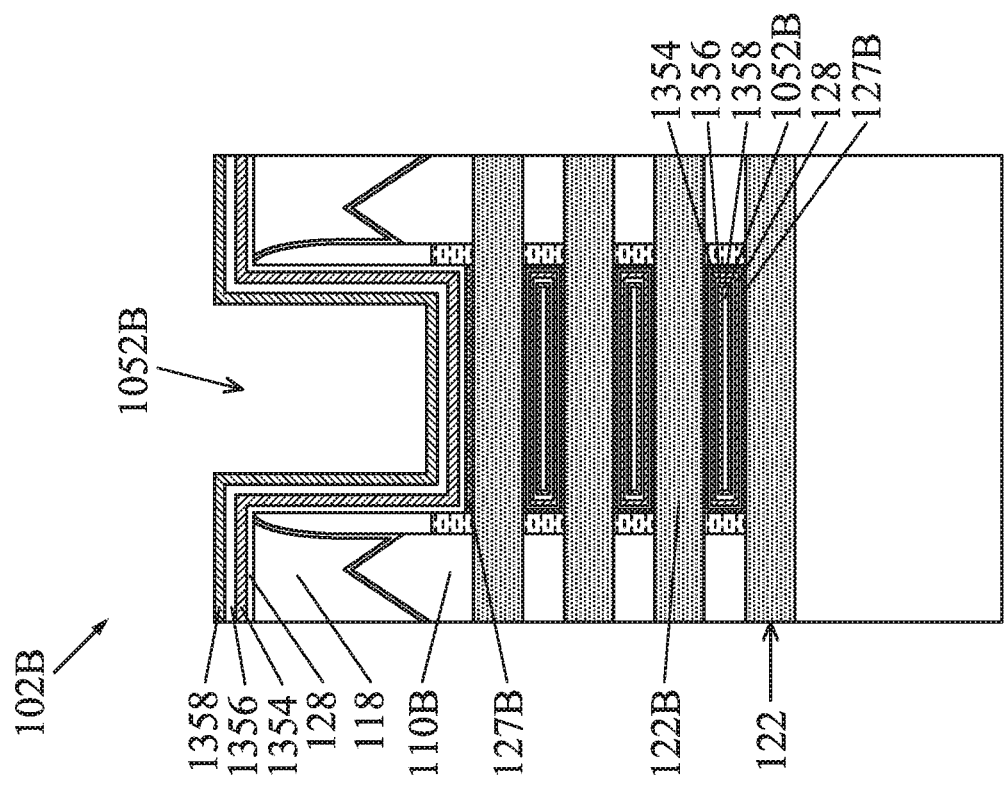

The deposition of gate dielectric layer 128 can include blanket depositing gate dielectric layer 128 on the partial semiconductor device 100 (not shown) formed after the formation of interfacial oxide layers 127A-127B. The blanket deposited gate dielectric layer 128 can be substantially conformally deposited on interfacial oxide layers 127A-127B and the exposed surfaces of the partial semiconductor device 100 (e.g., sidewalls of gate openings 1052A-1052B and top surfaces of ILD 118), as shown in FIGS. 13A-13B. In some embodiments, gate dielectric layer 128 can include a dielectric material with a dielectric constant (k-value) higher than about 3.9. In some embodiments, gate dielectric layer 128 can include (i) silicon oxide, silicon nitride, and/or silicon oxynitride, (ii) a high-k dielectric material, such as hafnium oxide ($HfO_2$), $TiO_2$, $HfZrO$, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. Gate dielectric layer 128 with high-k dielectric layer (e.g., $HfO_2$) can be formed by ALD and/or other suitable methods. In some embodiments, gate dielectric layer 128 can be formed with ALD using hafnium chloride ($HfCl_4$) as a precursor at a temperature ranging from about 250° C. to about 350° C. In some embodiments, gate dielectric layer 128 can have a thickness ranging from about 1 nm to about 3 nm in order to wrap around nanostructures channel regions 120B and 122B without being constrained by spacing between adjacent nanostructured channel regions 120B and between adjacent nanostructured channel regions 122B.

The formation of interfacial oxide layers 127A-127B and gate dielectric layer 128 can be followed by a three-stage annealing process to barrier layer (not shown) on gate dielectric layer 128 and to improve the electrical characteristics and/or reliability of interfacial oxide layers 127A-127B and/or gate dielectric layer 128. The first-stage annealing process can include sequential steps of (i) blanket depositing a metal nitride capping layer 1354 (FIGS. 13A-13B) on gate dielectric layer 128, (ii) in-situ blanket depositing a Si capping layer 1356 on metal nitride capping layer 1354, and (iii) performing a first spike annealing process on the partial semiconductor device 100 (not shown) formed after the in-situ blanket deposition of Si capping layer 1356.

In some embodiments, metal nitride capping layer 1354 can include TiSiN or TiN and can be deposited by an ALD or a CVD process using titanium tetrachloride ($TiCl_4$), silane ($SiH_4$), and ammonia ($NH_3$) as precursors at a temperature ranging from about 400° C. to about 500° C. Metal nitride capping layer 1354 can have a thickness ranging from about 1 nm to about 3 nm and can react with gate dielectric layer 128 during subsequent first and/or second spike annealing processes (described below) to form a barrier layer (not shown) on gate dielectric layer 128. In some embodiments, the barrier layer can include hafnium titanium silicate (HfTiSiO$_x$) with a thickness ranging from about 1 nm to about 3 nm. The barrier layer can be configured to prevent diffusion of elements (e.g., metals and oxygen) into interfacial oxide layers 127A-127B and/or gate dielectric layer 128 from overlying layers during subsequent processing.

The in-situ blanket deposition of Si capping layer 1356 can include an ALD, a CVD, or a PVD process. In some embodiments, the in-situ blanket deposition of Si capping layer 1356 can include a soaking process with $TiCl_4$ and $SiH_4$ gases at a temperature ranging from about 400° C. to about 500° C. The soaking process can include flowing $TiCl_4$ gas for a time period ranging from about 80 seconds to about 100 seconds and then flowing $SiH_4$ gas for a time period ranging from about 100 seconds to about 200 seconds on the surfaces of metal nitride capping layer 1354. In some embodiments, Si capping layer 1356 can include Si or its compound and/or can include amorphous or polycrystalline Si. Si capping layer 1356 can prevent oxidation of interfacial oxide layers 127A-127B and/or gate dielectric layer 128 and as a result, prevent additional growth of interfacial oxide layers 127A-127B and/or gate dielectric layer 128 during subsequent annealing processes and/or ex-situ processes.

The first spike annealing process can include performing an annealing process on the partial semiconductor device 100 (not shown) formed after the deposition of Si capping layer 1356 in a nitrogen ambient at an annealing temperature ranging from about 850° C. to about 900° C. for a time period ranging from about 1 second to about 5 seconds. According to some embodiments, the first spike annealing process can strengthen the chemical bonds at the interface between interfacial oxide layers 127A-127B and gate dielectric layer 128 to improve the reliability of interfacial oxide layers 127A-127B and/or gate dielectric layer 128, and consequently, improve the reliability of gate structures 112A-112B.

The second-stage annealing process can include sequential steps of (i) ex-situ blanket depositing a Si capping layer 1358 (FIGS. 13A-13B) on Si capping layer 1356 after the first spike annealing process and (ii) performing a second spike annealing process on the partial semiconductor device 100 (not shown) formed after the ex-situ blanket deposition of Si capping layer 1358.

The ex-situ blanket deposition of Si capping layer 1358 can include an ALD, a CVD, or a PVD process. In some embodiments, the ex-situ blanket deposition of Si capping layer 1358 can include depositing a silicon-based layer on Si capping layer 1356 by a CVD process using $SiH_4$, disaline ($Si_2H_6$), and hydrogen at a temperature ranging from about 350° C. to about 450° C. Si capping layer 1358 can be deposited with a thickness (e.g., about 2 nm to about 5 nm) about 2 to about 5 times greater than the thickness of Si capping layer 1356. The thicker Si capping layer 1358 can prevent oxidation of interfacial oxide layers 127A-127B and/or gate dielectric layer 128 during the subsequent second annealing process, which is performed at a temperature higher than that of the first spike annealing process. The second spike annealing process can be performed in a nitrogen ambient at an annealing temperature ranging from about 900° C. to about 950° C. for a time period ranging from about 1 second to about 10 seconds.

Figure 14B:
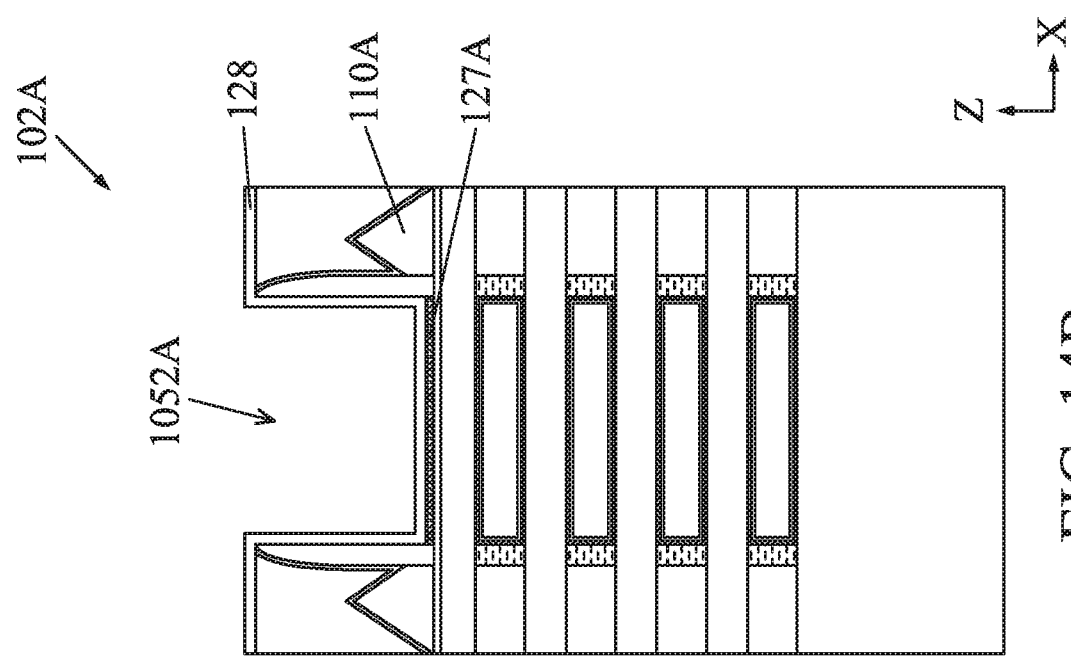
Figure 14A:
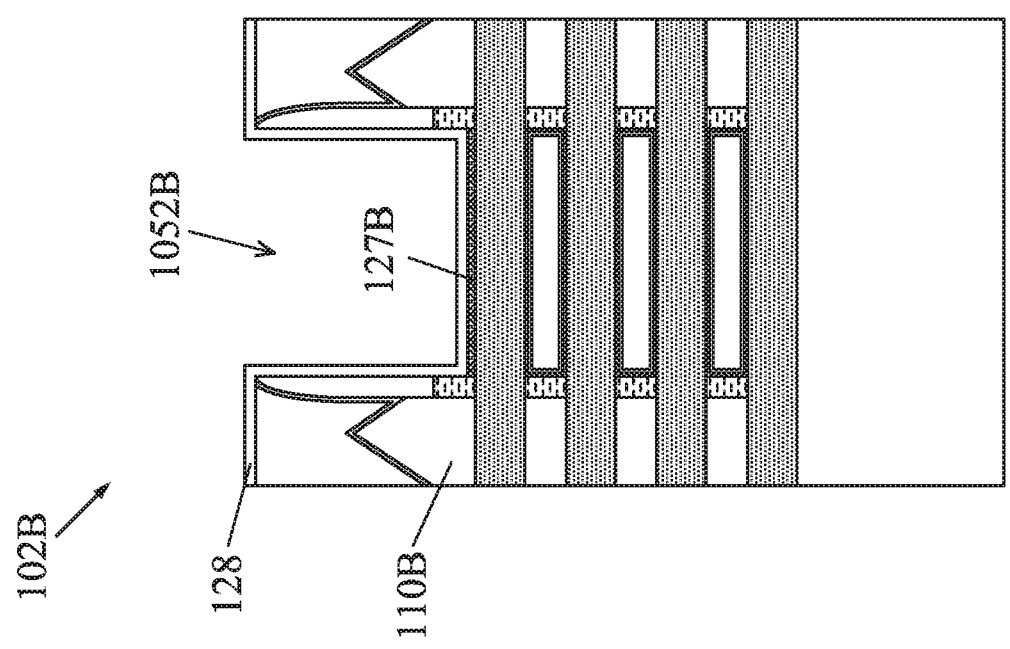

The third-stage annealing process can include sequential steps of (i) removing metal nitride layer 1354, in-situ Si capping layer 1356, and ex-situ Si capping layer 1358 after the second spike annealing process (FIGS. 14A-14B) and (ii) performing a third spike annealing process on the structures of FIGS. 14A-14B. Metal nitride layer 1354, in-situ Si capping layer 1356, and ex-situ Si capping layer 1358 can be removed by a wet etching process. In some embodiments, the wet etching process can include etching in DHF, KOH solution, SC1 solution, or a combinations thereof. The third spike annealing process can be performed in an $NH_3$ ambient at an annealing temperature ranging from about 850° C. to about 950° C. The third spike annealing process can incorporate nitrogen into gate dielectric layer 128 to remove defects, such as oxygen vacancies from gate dielectric layer 128 and as a result, improve the reliability of gate structures 112A-112B (shown in FIG. 1A). In some embodiments, the annealing temperatures of the first and third spike annealing processes can be similar to or different from each other. In some embodiments, the annealing temperature of the second spike annealing process can be higher than the annealing temperatures of the first and third spike annealing processes.

Referring to FIG. 3, in operation 330, an nWFM layer and a Si capping layer are selectively formed on the nanostructured channel regions of the NFET. For example, an nWFM layer 130A* and Si capping layer 131* can be selectively formed on nanostructured channel regions 120B of FET 102A, as described with reference to FIGS. 15A-16B. During subsequent processing, nWFM layer 130A* and Si capping layer 131* can form nWFM layer 130A and Si capping layer 131 as shown in FIGS. 1A-1B and 1D. The process for selectively forming nWFM layer 130A* and Si capping layer 131* on nanostructured channel regions 120B can include sequential steps of (i) blanket depositing nWFM layer 130A* (FIGS. 15A-15B) on the structures of FIGS. 14A-14B after the third spike annealing process, (ii) blanket depositing Si capping layer 131* (FIGS. 15A-15B) on nWFM layer 130A*, (iii) selectively forming a masking layer 1560 (e.g., a photoresist layer or a nitride layer) on the portion of Si capping 131* of FET 102A as shown in FIG. 15B, (iv) selectively removing portions of nWFM layer 130A* and Si capping 131* of FET 102B to form the structure of FIG. 16A, and (v) removing masking layer 1560 to form the structure of FIG. 16B.

The blanket deposition of nWFM layer 130A* can include blanket depositing about 1 nm to about 3 nm thick Al-based nWFM layer on gate dielectric layer 128 with an ALD or a CVD process using titanium tetrachloride ($TiCl_4$) and titanium ethylene aluminum (TEAl) or tantalum chloride (TaCl5) and trimethylaluminium (TMA) as precursors at a temperature ranging from about 350° C. to about 450° C. In some embodiments, the Al-based nWFM layer can be deposited in an ALD process of about 4 cycles to about 12 cycles, where one cycle can include sequential periods of: (i) first precursor gas (e.g., $TiCl_4$ or $TaCl_5$) flow, (ii) a first gas purging process, (iii) a second precursor gas (e.g., TEAl or TMA) gas flow, and (iv) a second gas purging process. In some embodiments, the Al-based nWFM layer can include titanium aluminum (TiAl), titanium aluminum carbide (TiAlC), tantalum aluminum (TaAl), tantalum aluminum carbide (TaAlC), or a combination thereof. The blanket deposited nWFM layer 130A* can be substantially conformally deposited (e.g., step coverage of about 99%) on gate dielectric layer 128 as shown in FIGS. 15A-15B. In some embodiments, instead of blanket depositing the Al-based nWFM layer, a metallic layer (e.g., TiN, TiC, TaN, TaC) can be blanket deposited on gate dielectric layer 128 followed by a doping process with Al dopants to form nWFM layer 130A*.

The blanket deposition of Si capping layer 131* can include blanket depositing about 0.5 nm to about 2 nm thick Si-based layer on nWFM layer 130A* with a soaking process in an ALD or a CVD chamber using $TiCl_4$ and $SiH_4$ gases at a temperature ranging from about 300° C. to about 500° C. and pressure ranging from about 3 torr to about 30 torr. The soaking process can include flowing $TiCl_4$ gas for a time period ranging from about 80 seconds to about 100 seconds and then flowing $SiH_4$ gas for a time period ranging from about 100 seconds to about 200 seconds on the surfaces of nWFM layer 130A*. In some embodiments, the Si-based layer can include Si or its compound and/or can include amorphous or polycrystalline Si. The blanket deposited Si capping layer 131* can be substantially conformally deposited (e.g., step coverage of about 99%) on nWFM layer 130A* as shown in FIGS. 15A-15B.

The selective formation of masking layer 1560 can include depositing and patterning a layer of photoresist or nitride on Si capping layer 131* to form the structures of FIGS. 15A-15B. The selective removal of the portions of nWFM layer 130A* and Si capping 131* not protected by masking layer 1560 can include a wet etching process using etchants with a higher etch selectivity for nWFM layer 130A* and Si capping 131* than masking layer 1560. In some embodiments, the etchants can include a mixture of ammonia hydroxide, hydrogen peroxide, and water (SC1 solution), and/or a mixture of hydrochloric acid, hydrogen peroxide, water (SC2 solution) and the etching time period can be about 2 min to about 5 min. Masking layer 1560 can be removed after the wet etching process to form the structure of FIG. 16B.

Referring to FIG. 3, in operation 335, a bi-layer of pWFM layers are deposited on a portion of the gate dielectric layer of the PFET and on the Si capping layer of the NFET. For example, a bi-layer of pWFM layer 130B 1*-130B2* can be deposited partly on the portion of gate dielectric layer 128 of FET 102B (FIG. 17A) and partly on Si capping layer 131* (FIG. 17B) as described with reference to FIGS. 17A-17B. During subsequent processing, the portions of pWFM layer 130B1*-130B2* on gate dielectric layer 128 of FET 102B can form pWFM layers 130B1-130B2, respectively, as shown in FIGS. 1A-1B and 1C and the portions of pWFM layer 130B1*-130B2* on Si capping layer 131* can form capping layers 132A-132B, respectively, as shown in FIGS. 1A-1B and 1D.

Figure 16B:
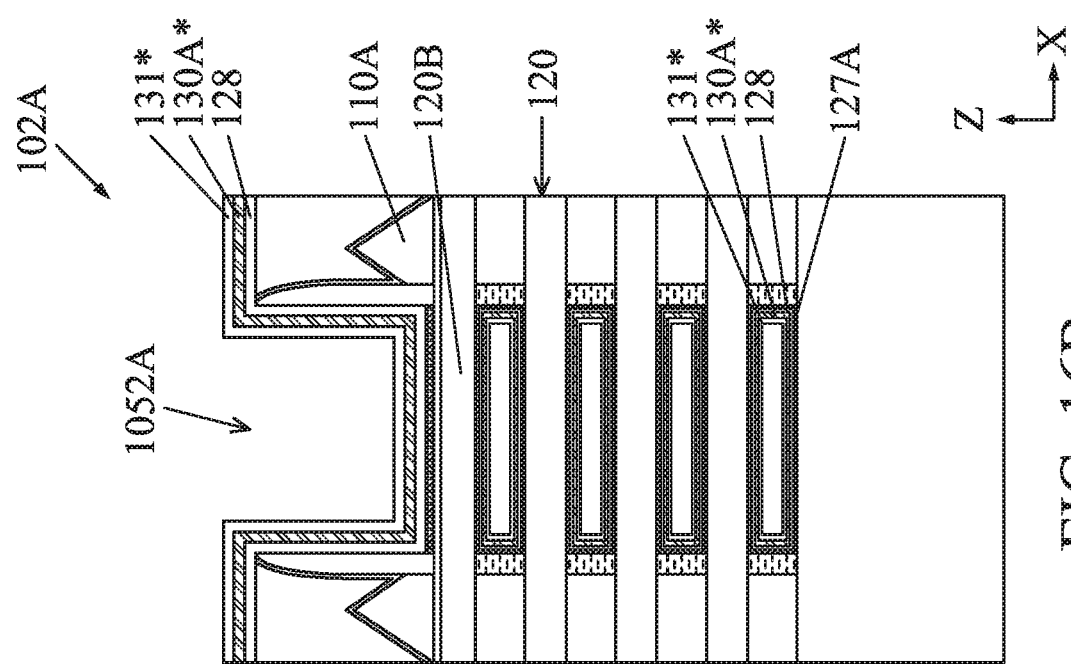
Figure 16A:
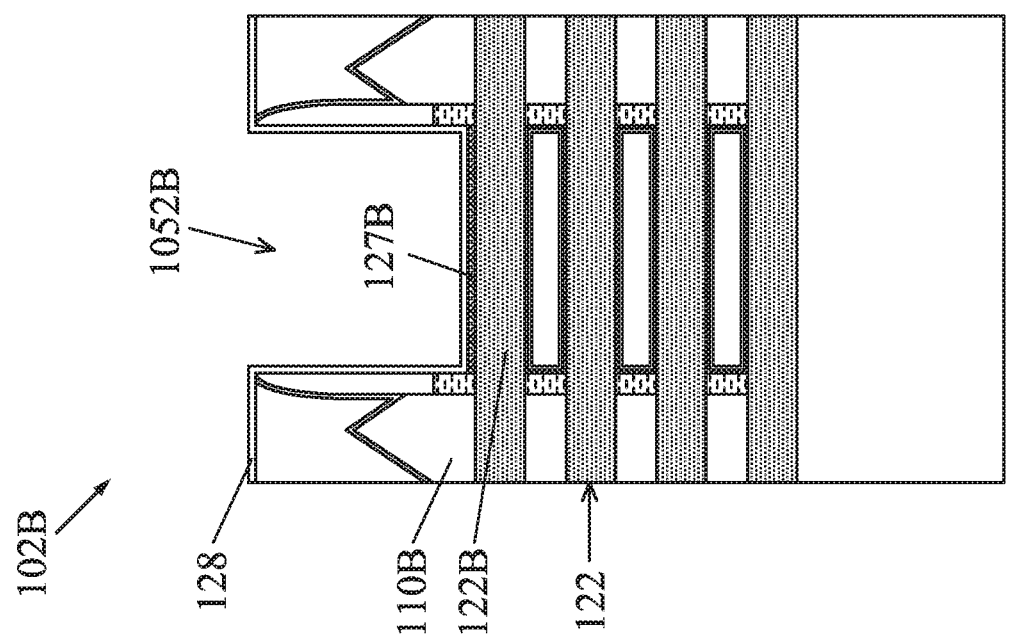

The deposition of the bi-layer of pWFM layer 130B1*-130B2* can include sequential steps of (i) blanket depositing pWFM layer 130B1* on the structures of FIGS. 16A-16B and (ii) blanket depositing pWFM layer 130B2* on pWFM layer 130B1*. The blanket deposition of pWFM layer 130B1* can include blanket depositing about 1 nm to about 3 nm thick Al-free pWFM layer with an ALD or a CVD process using titanium tetrachloride ($TiCl_4$) and $NH_3$ as precursors at a temperature ranging from about 350° C. to about 475° C. In some embodiments, the Al-free pWFM layer can be deposited in an ALD process of about 30 cycles to about 90 cycles, where one cycle can include sequential periods of: (i) first precursor gas (e.g., $TiCl_4$) flow, (ii) a first gas purging process, (iii) a second precursor gas (e.g., $NH_3$) gas flow, and (iv) a second gas purging process. In some embodiments, the Al-free pWFM layer can include substantially Al-free (e.g., with no Al) Ti-based nitrides or alloys. The blanket deposited pWFM layer 130B1* can be substantially conformally deposited (e.g., step coverage of about 99%) on the structures of FIGS. 16A-16B.

The blanket deposition of pWFM layer 130B2* can include in-situ blanket depositing about 1 nm to about 3 nm thick Al-free pWFM layer with an ALD or a CVD process using pentakis-dimethylamino tantalum (PDMAT) and $NH_3$ as precursors at a temperature ranging from about 200° C. to about 300° C. The in-situ blanket deposition of pWFM layer 130B2* can include performing the deposition in the same deposition chamber as pWFM layer 130B1* and/or in the same integration module as pWFM layer 130B1* without a vacuum break between the deposition of pWFM layers 130B1* and 130B2*. In some embodiments, the Al-free pWFM layer for pWFM layer 130B2* can be deposited in an ALD process of about 20 cycles to about 50 cycles, where one cycle can include sequential periods of: (i) first precursor gas (e.g., PDMAT) flow, (ii) a first gas purging process, (iii) a second precursor gas (e.g., $NH_3$) gas flow, and (iv) a second gas purging process. In some embodiments, the Al-free pWFM layer for pWFM layer 130B2* can include substantially Al-free (e.g., with no Al) Ta-based nitrides or alloys. The blanket deposited pWFM layer 130B2* can be substantially conformally deposited (e.g., step coverage of about 99%) on pWFM layer 130B1* as shown in FIGS. 16A-16B.

Referring to FIG. 3, in operation 340, a fluorine blocking layer and a gate metal fill layer are deposited on the bi-layer of pWFM layers. For example, a fluorine blocking layer 134 can be deposited on pWFM layer 130B2* and a gate metal fill layer 135 can be deposited on fluorine blocking layer 134 as described with reference to FIGS. 17A-17B. During subsequent processing, fluorine blocking layer 134 and gate metal fill layer 135 can form fluorine blocking layers 134A-134B and gate metal fill layers 135A-135B, respectively, as shown in FIGS. 1A-1B.

The deposition of fluorine blocking layer 134 can include blanket depositing a fluorine-free metal layer (e.g., a FFW layer) on pWFM layer 130B2*. The blanket deposition of fluorine-free metal layer can include blanket depositing about 2 nm to about 4 nm thick fluorine-free metal layer with an ALD or a CVD process using $WCl_5$ or $WCl_6$ and $H_2$ as precursors at a temperature ranging from about 400° C. to about 470° C. In some embodiments, the fluorine-free metal layer can be deposited in an ALD process of about 160 cycles to about 320 cycles, where one cycle can include sequential periods of: (i) first precursor gas (e.g., $WCl_5$ or $WCl_6$) flow, (ii) a first gas purging process, (iii) a second precursor gas (e.g., $H_2$) gas flow, and (iv) a second gas purging process. The blanket deposited fluorine blocking layer 134 can be substantially conformally deposited (e.g., step coverage of about 99%) on pWFM layer 130B2*.

Figure 17B:
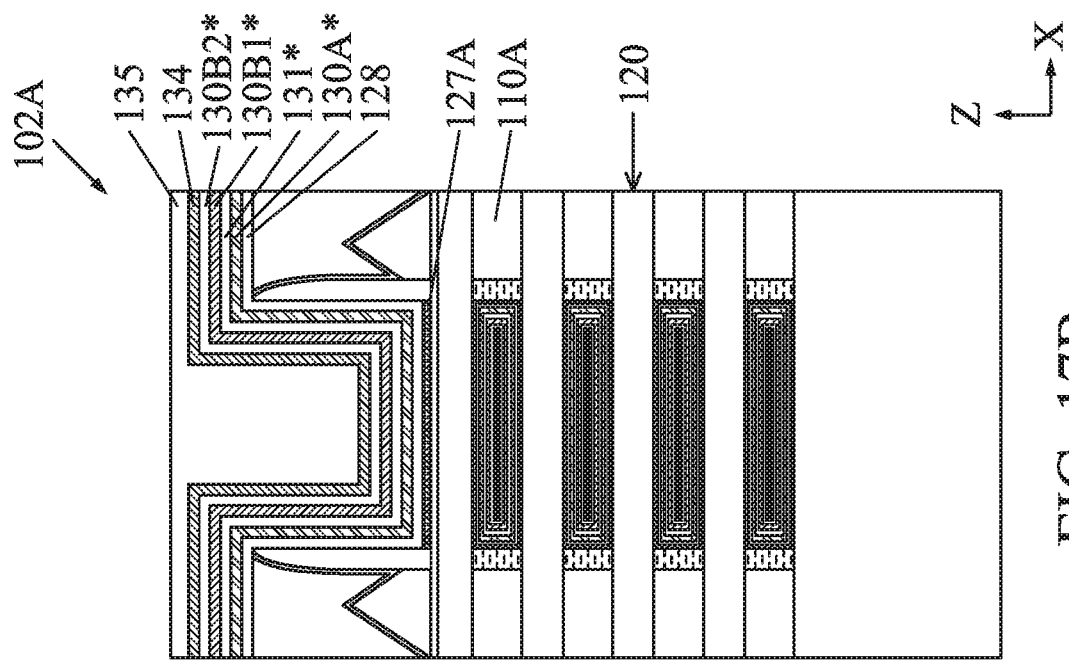
Figure 17A:
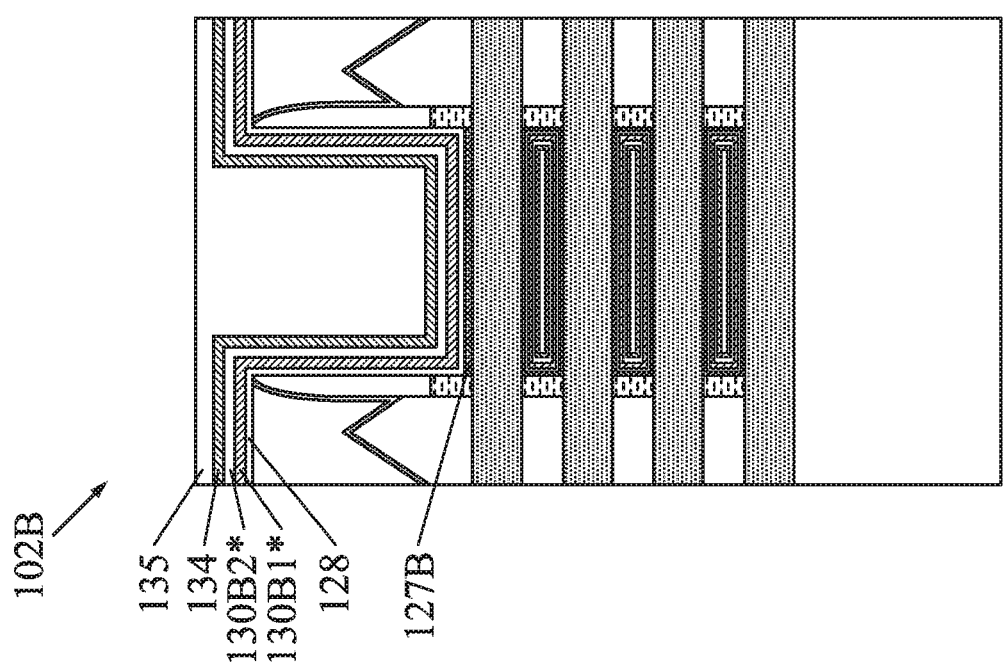

The deposition of fluorine blocking layer 134 can be followed by the deposition of gate metal fill layer 135 on fluorine blocking layer 134 until gate openings 1052A-1052B are filled as shown in FIGS. 17A-17B. The deposition of gate metal fill layer 135 can include blanket depositing about 150 nm to about 200 nm thick metal layer with a CVD process using $WCl_5$ or $WCl_6$ and $H_2$ as precursors at a temperature ranging from about 300° C. to about 400° C.

Referring to FIG. 3, in operation 345, the gate dielectric layer, nWFM layer, Si capping layer, pWFM layers, fluorine blocking layer, and gate metal fill layer are polished. For example, gate dielectric layer 128, nWFM layer 130A*, Si capping layer 131*, pWFM layers 130B1*-130B2*, fluorine blocking layer 134, and gate metal fill layer 135 can be polished by a chemical mechanical polishing process to substantially coplanarize top surfaces of gate dielectric layer 128, nWFM layer 130A*, Si capping layer 131*, pWFM layers 130B1*-130B2*, fluorine blocking layer 134, and gate metal fill layer 135 with top surface of ILD layer 118 as shown in FIGS. 1A-1D. As a result of the polishing process, gate structures 112A-112B can be formed as shown in FIGS. 1A-1D. Thus, as described in operations 325-345, gate structures 112A-112B can be formed using an nWFM-first scheme in which Al-based nWFM layer (e.g., nWFM layer 130A*) can be formed prior to the formation of Al-free pWFM layers (e.g., pWFM layers 130B1*-130B2*) to prevent or substantially reduce contamination of the Al-free pWFM layers with Al from the Al-based nWFM layer.

The formation of gate structures 112A-112B can be followed by formation of other elements such as S/D contacts, gate contacts, vias, interconnect metal layers, dielectric layers, passivation layers, etc., which are not shown for the sake of clarity.

The present disclosure provides example structures of FETs (e.g., FETs 102A-102B) with different gate structures (e.g., gate structures 112A-112B) configured to provide ultra-low threshold voltages and example methods of forming such FETs on a same substrate (e.g., substrate 106). The example methods form FETs of different conductivity types with different work function values, and as a result, with different and/or ultra-low threshold voltages on the same substrate. These example methods can be less complicated and more cost-effective in manufacturing reliable gate structures in FETs with nanostructured channel regions and with ultra-low threshold voltages than other methods of forming FETs with similar channel dimensions and threshold voltages on the same substrate. In addition, these example methods can form FET gate structures with smaller dimensions (e.g., thinner gate stacks) than other methods of forming FETs with similar threshold voltages. For example, using these example methods, the thicknesses of gate stack layers can be reduced by about 50% to about 75% compared to the thicknesses of gate stack layers formed using the other methods.

In some embodiments, NFETs (e.g., FET 102A) and PFETs (e.g., FET 102B) with different gate stack layer configurations can be selectively formed on the same substrate. To achieve NFETs and PFETs with ultra-low threshold voltages, NFETs and PFETs can include Al-based NFET gate stacks and substantially Al-free (e.g., with no Al) PFET gate stacks, respectively. The NFET and PFET gate stacks can have nWFM layers (e.g., nWFM layer 130A) and pWFM layers (e.g., pWFM layers 130B1-130B2) in physical contact with gate dielectric layers (e.g., gate dielectric layers 128A-128B) of the NFETs and PFETs, respectively. The NFET gate stacks can include Al-based nWFM layers (e.g., Al-based titanium (Ti) or tantalum (Ta) alloys) and the PFET gate stacks can include substantially Al-free (e.g., with no Al) pWFM bi-layers (e.g., Al-free Ti and Ta nitrides or alloys) with thicknesses smaller than about 3 nm (e.g., about 0.5 nm to about 3 nm) to achieve ultra-low threshold voltages. In some embodiments, TaN of the pWFM bi-layers can prevent underlying layers from being etched during subsequent processing (e.g., deposition of fluorine-free tungsten (FFW) layer) and protect the integrity of the pWFM layers, thus improving the reliability of PFET gate structures. In some embodiments, the reliability of the NFET gate structures can be improved with the selective formation of Si capping layers on the Al-based nWFM layers. The Si capping layers can prevent the oxidation of the Al-based nWFM layers and as a result, prevent an increase in work function values of the Al-based nWFM layers.

In some embodiments, a method of fabricating a semiconductor device includes forming first and second stacks of first and second nanostructured layers arranged in an alternating configuration on a substrate, growing first and second epitaxial regions of opposite conductivity type on the first and second stacks, respectively, forming first and second nanostructured channel regions in the first and second nanostructured layers of the first and second stacks, respectively, and forming first and second gate-all-around (GAA) structures surrounding the first and second nanostructured channel regions, respectively. The forming the first and second GAA structures includes depositing a gate dielectric layer surrounding the first and second nanostructured channel regions, selectively forming an Al-based n-type work function metal layer and a Si-based capping layer on the first nanostructured channel regions, depositing a bi-layer of Al-free p-type work function metal layers on the first and second nanostructured channel regions, depositing a fluorine blocking layer on the bi-layer of Al-free p-type work function layers, and depositing a gate metal fill layer on the fluorine blocking layer.

In some embodiments, a method of fabricating a semiconductor device includes forming first and second stacks of first and second nanostructured layers arranged in an alternating configuration on a substrate, growing first and second epitaxial regions of opposite conductivity type on the first and second stacks, respectively, forming first and second nanostructured channel regions in the first and second nanostructured layers of the first and second stacks, respectively, depositing a gate dielectric layer on the first and second nanostructured channel regions, forming a barrier layer on the gate dielectric layer, selectively forming an n-type work function metal layer and a capping layer on the first nanostructured channel regions, depositing a bi-layer of Al-free p-type work function metal layers on the first and second nanostructured channel regions, and depositing a gate metal fill layer on the bi-layer of Al-free p-type work function layers.

In some embodiments, a semiconductor device includes a substrate, first and second stacks of first and second nanostructured layers arranged in an alternating configuration on the substrate, first and second nanostructured channel regions in the first and second nanostructured layers of the first and second stacks, respectively, and first and second gate dielectric layers wrapped around the first and second nanostructured channel regions, respectively, an Al-based n-type work function metal layer in physical contact with the first gate dielectric layer, a Si-based capping layer on the Al-based n-type work function metal layer, first and second bi-layers of Al-free p-type work function metal layers in physical contact with the second gate dielectric layer and the Si-based capping layer, respectively, first and second fluorine blocking layers on the first and second bi-layers of p-type work function layers, and first and second gate metal fill layers on the first and second fluorine blocking layers.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

forming first and second stacks of first and second nanostructured layers arranged in an alternating configuration on a substrate;

growing first and second epitaxial regions of opposite conductivity type on the first and second stacks, respectively;

forming first and second nanostructured channel regions in the first and second nanostructured layers of the first and second stacks, respectively; and
forming first and second gate-all-around (GAA) structures surrounding the first and second nanostructured channel regions, respectively, wherein the forming the first and second GAA structures comprises:
depositing a gate dielectric layer surrounding the first and second nanostructured channel regions;
selectively forming an Al-based n-type work function metal layer and a Si-based capping layer on the first nanostructured channel regions;
depositing a bi-layer of Al-free p-type work function metal layers on the first and second nanostructured channel regions;
depositing a fluorine blocking layer on the bi-layer of Al-free p-type work function layers; and
depositing a gate metal fill layer on the fluorine blocking layer.

2. The method of claim 1, wherein the selectively forming the Al-based n-type work function metal layer and the Si-based capping layer comprises:
depositing a layer of Al-based metallic material on the gate dielectric layer, wherein the Al-based metallic material has a work function value closer to a conduction band energy than a valence band energy of the first nanostructured channel regions; and
in-situ depositing a layer of Si-based material on the layer of Al-based metallic material.

3. The method of claim 2, wherein the selectively forming the Al-based n-type work function metal layer and the Si-based capping layer further comprises:
selectively forming a masking layer on first portions of the layers of Al-based metallic material and Si-based material on the first nanostructured channel regions; and
etching second portions of the layers of Al-based metallic material and Si-based material on the second nanostructured channel regions.

4. The method of claim 1, wherein the selectively forming the Al-based n-type work function metal layer and the Si-based capping layer comprises:
depositing a layer of Al-based metallic material on the gate dielectric layer, wherein the Al-based metallic material has a work function value closer to a conduction band energy than a valence band energy of the first nanostructured channel regions; and
performing an in-situ soaking process with Ti-based and Si-based precursors on the layer of Al-based metallic material.

5. The method of claim 1, wherein the selectively forming the Al-based n-type work function metal layer and the Si-based capping layer comprises:
depositing a layer of metallic material on the gate dielectric layer;
doping the layer of metallic material with Al dopants to form a layer of Al-based metallic material with a work function value closer to a conduction band energy than a valence band energy of the first nanostructured channel regions; and
in-situ depositing a layer of Si-based material on the layer of Al-doped metallic material.

6. The method of claim 1, wherein the selectively forming the Al-based n-type work function metal layer and the Si-based capping layer comprises:
depositing a layer of metallic material on the gate dielectric layer;
doping the layer of metallic material with Al dopants to form a layer of Al-based metallic material with a work function value closer to a conduction band energy than a valence band energy of the first nanostructured channel regions; and
performing an in-situ soaking process with Ti-based and Si-based precursors on the layer of Al-based metallic material.

7. The method of claim 1, wherein the depositing the bi-layer of Al-free p-type work function metal layers comprises:
depositing a first layer of Al-free metallic material on the Si-based capping layer and a portion of the gate dielectric layer on the second nanostructured channel regions; and
depositing a second layer of Al-free metallic material on the first layer of Al-free metallic material, wherein the Al-free metallic materials of the first and second layers of Al-free metallic material are different from each other and both the Al-free metallic materials have work function values closer to a valence band energy than a conduction band energy of the second nanostructured channel regions.

8. The method of claim 1, wherein the forming the first and second GAA structures further comprises forming metal-based capping layers on the Si-based capping layer.

9. The method of claim 1, wherein the forming the first and second GAA structures further comprises:
forming first gate openings between adjacent first epitaxial regions and second gate openings between adjacent second epitaxial regions;
selectively forming the Al-based n-type work function metal layer and a Si-based capping layer within the first gate openings; and
depositing the bi-layer of Al-free p-type work function metal layers within the first and second gate openings.

10. The method of claim 1, wherein the forming the first and second GAA structures further comprises:
forming first gate openings between adjacent first nanostructured channel regions and second gate openings between adjacent second nanostructured channel regions;
selectively forming the Al-based n-type work function metal layer and a Si-based capping layer within the first gate openings; and
depositing the bi-layer of Al-free p-type work function metal layers within the first and second gate openings.

11. A method of fabricating a semiconductor device, comprising:
forming first and second stacks of first and second nanostructured layers arranged in an alternating configuration on a substrate;
growing first and second epitaxial regions of opposite conductivity type on the first and second stacks, respectively;
forming first and second nanostructured channel regions in the first and second nanostructured layers of the first and second stacks, respectively;
depositing a gate dielectric layer on the first and second nanostructured channel regions;
forming a barrier layer on the gate dielectric layer;
selectively forming an n-type work function metal layer and a Si-based capping layer on the first nanostructured channel regions;
depositing a bi-layer of Al-free p-type work function metal layers on the first and second nanostructured channel regions; and depositing a gate metal fill layer on the bi-layer of Al-free p-type work function layers.

12. The method of claim 11, wherein the selectively forming the n-type work function metal layer and the Si-based capping layer comprises:
depositing a layer of Al-based metallic material on the gate dielectric layer, wherein the Al-based metallic material has a work function value closer to a conduction band energy than a valence band energy of the first nanostructured channel regions; and
performing an in-situ soaking process with Ti-based and Si-based precursors on the layer of Al-based metallic material.

13. The method of claim 12, wherein the selectively forming the n-type work function metal layer and the Si-based capping layer further comprises:
selectively forming a masking layer on first portions of the layers of Al-based metallic material and Si-based material on the first nanostructured channel regions; and
etching second portions of the layers of Al-based metallic material and Si-based material on the second nanostructured channel regions.

14. The method of claim 11, wherein the selectively forming the n-type work function metal layer and the Si-based capping layer comprises:
depositing a layer of metallic material on the gate dielectric layer;
doping the layer of metallic material with Al dopants to form a layer of Al-doped metallic material with a work function value closer to a conduction band energy than a valence band energy of the first nanostructured channel regions; and
performing an in-situ soaking process with Ti-based and Si-based precursors on the layer of Al-doped metallic material.

15. The method of claim 11, wherein the depositing the bi-layer of Al-free p-type work function metal layers comprises:
depositing a first layer of Al-free metallic material on the Si-based capping layer and a portion of the gate dielectric layer on the second nanostructured channel regions; and
depositing a second layer of Al-free metallic material on the first layer of Al-free metallic material, wherein the Al-free metallic materials of the first and second layers of Al-free metallic material are different from each other, and wherein the Al-free metallic materials of the first and second layers of Al-free metallic material have work function values closer to a valence band energy than a conduction band energy of the second nanostructured channel regions.

16. The method of claim 11, wherein the forming the barrier layer on the gate dielectric layer comprises:
depositing a metallic capping layer on the gate dielectric layer;
in-situ depositing a first Si-based capping on the metallic capping layer;
performing a first spike annealing process at a first temperature;
ex-situ depositing a second Si-based capping layer on the first Si-based capping layer; and
performing a second spike annealing process at a second temperature higher than the first temperature.

17. A method, comprising:
forming first and second fin structures on a substrate;
forming a first gate opening surrounding a first stack of nanostructured channel regions on the first fin structure;
forming a second gate opening surrounding a second stack of nanostructured channel regions on the second fin structure;
forming a gate dielectric layer with first and second layer portions, wherein the first layer portion is formed within the first gate opening and the second layer portion is formed within the second gate opening;
selectively forming an Al-based n-type work function metal layer on the first layer portion;
selectively forming a Si-based capping layer on the Al-based n-type work function metal layer;
forming a bi-layer of Al-free p-type work function metal layers on the second layer portion and on the first layer portion; and
forming a gate metal fill layer over the bi-layer of Al-free p-type work function metal layers.

18. The method of claim 17, further comprising forming first and second oxide layers within the first and second gate openings, respectively, prior to forming the gate dielectric layer.

19. The method of claim 17, further comprising forming a barrier layer on the gate dielectric layer.

* * * * *